US006849346B2

(12) United States Patent
Matsuo et al.

(10) Patent No.: US 6,849,346 B2
(45) Date of Patent: Feb. 1, 2005

(54) ELECTRODE AND THIN FILM EL DEVICE INCLUDING THE SAME AND METHODS OF FABRICATING THE SAME AND DISPLAY DEVICE AND LIGHTING SYSTEM INCLUDING THE THIN FILM EL DEVICE

(75) Inventors: Mikiko Matsuo, Nara (JP); Tetsuya Satou, Kadoma (JP); Hisanori Sugiura, Hirakata (JP); Hitoshi Hisada, Toyonaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 183 days.

(21) Appl. No.: 10/169,974

(22) PCT Filed: Jan. 15, 2001

(86) PCT No.: PCT/JP01/00195

§ 371 (c)(1),
(2), (4) Date: Aug. 6, 2002

(87) PCT Pub. No.: WO01/52606

PCT Pub. Date: Jul. 19, 2001

(65) Prior Publication Data

US 2003/0116775 A1 Jun. 26, 2003

(30) Foreign Application Priority Data

Jan. 13, 2000 (JP) .......................................... 2000-004295

(51) Int. Cl.$^7$ ....................... H05B 33/10; H05B 33/14; H05B 33/22; H05B 33/26
(52) U.S. Cl. ..................... 428/690; 428/917; 313/502; 313/504; 313/506; 257/59; 257/98; 257/172
(58) Field of Search ................. 428/690, 917; 313/502, 504, 506; 257/98, 59, 172; 427/66

(56) References Cited

U.S. PATENT DOCUMENTS

| | | | | |
|---|---|---|---|---|
| 4,885,211 A | * | 12/1989 | Tang et al. ................. | 428/457 |
| 5,059,862 A | * | 10/1991 | VanSlyke et al. ........... | 313/503 |
| 5,486,406 A | | 1/1996 | Shi ............................. | 428/209 |
| 5,601,903 A | | 2/1997 | Fujii et al. .................. | 428/212 |
| 5,739,635 A | | 4/1998 | Wakimoto .................. | 313/504 |
| 5,972,247 A | | 10/1999 | Shi et al. .................... | 252/583 |
| 5,994,052 A | | 11/1999 | Weaver et al. ............. | 430/617 |
| 6,391,482 B1 | | 5/2002 | Matsuo et al. ............. | 428/690 |

FOREIGN PATENT DOCUMENTS

| | | |
|---|---|---|
| EP | 1 067 165 A2 | 1/2001 |
| JP | 04-230997 | 8/1992 |
| JP | 05-121172 | 5/1993 |
| JP | 07-026255 | 1/1995 |
| JP | 7-65958 | 3/1995 |
| JP | 07-126615 | 5/1995 |
| JP | 07-268317 | 10/1995 |
| JP | 8-225579 | 1/1996 |
| JP | 08-031574 | 2/1996 |
| JP | 08-048656 | 2/1996 |
| JP | 10-134961 | 5/1996 |
| JP | 08-259939 | 10/1996 |
| JP | 9-17574 | 1/1997 |
| JP | 09-316441 | 12/1997 |
| JP | 10-228982 | 8/1998 |
| JP | 10-270171 | 10/1998 |
| JP | 11-054277 | 2/1999 |
| JP | 11-121176 | 4/1999 |
| JP | 11-121177 | 4/1999 |
| JP | 11-233262 | 8/1999 |
| JP | 11-312588 | 11/1999 |
| JP | 11-314463 | 11/1999 |
| JP | 2000-113990 | 4/2000 |
| JP | 2000-315580 | 11/2000 |
| JP | 2001-3044 | 1/2001 |
| JP | 2001-43973 | 2/2001 |
| JP | 2001-76878 | 3/2001 |

OTHER PUBLICATIONS

Japanese Patent Office English abstract and machine translation for JP 08–225579.*
Inorganic Chemistry, 1997, vol. 36, pp. 2103–2111.*
Pei et al., "Polymer Light–Emitting Electrochemical Cells," Science, Aug. 25, 1995, vol. 269, pp 1086–1088.
Tang et al., "Organic Electroluminescent Diodes," Appl. Phys. Lett. 51, Sep. 21, 1987, pp 913–915.
Wakimoto et al., "Organic EL Cells Using Alkaline metal Compounds as Electron Injection Materials," IEEE Transactions on Electron Devices, vol. 44, No. 8, Aug. 1997, pp 1245–1248.

* cited by examiner

Primary Examiner—Dawn Garrett
(74) Attorney, Agent, or Firm—Parkhurst & Wendel, L.L.P.

(57) ABSTRACT

A thin film EL device is disclosed which includes a hole-injecting electrode, an electron-injecting electrode paired with the hole-injecting electrode, and a functional layer provided between the hole-injecting electrode and the electron-injecting electrode and emitting light by application of an electric field produced by the electrodes. The electron-injecting electrode contains at least two or more different metals having different work functions and a capturing substance for capturing a low work function metal, which is a metal other than a highest work function metal among the above-described metals, in its ionic state. This configuration prevents deterioration of the low work function metal, increasing the luminance and lifetime of the device.

44 Claims, 17 Drawing Sheets

ELECTRODE AND THIN FILM EL DEVICE INCLUDING THE SAME AND METHODS OF FABRICATING THE SAME AND DISPLAY DEVICE AND LIGHTING SYSTEM INCLUDING THE THIN FILM EL DEVICE

TECHNICAL FIELD

The present invention relates to a thin film EL device applied to lighting such as a backlight for a light-emitting display and a liquid crystal display and a method of fabricating such a thin film EL device. The present invention further relates to a display device and a lighting system provided with the thin film EL device.

BACKGROUND ART

Thin film EL devices provided with electroluminescent (hereinafter referred to as EL) panels have features such as high visibility, excellent display capability, and high speed response.

Of the thin film EL devices, on, for example, organic EL devices utilizing organic compounds as the constituent material, various reports have been made. Among these reports, for example, C. W. Tang et al. proposed an organic electroluminescent device (organic EL device) having an organic luminescent layer and a hole-transporting layer stacked on top of each other (Applied Physics Letters, 51, 1987, p. 913). Up until today, the research and development of the thin film EL device have been conducted based on this organic electroluminescent device having a basic configuration.

The basic configuration of the organic electroluminescent device will be described below.

FIG. 16 is a schematic cross-sectional view showing a prior art organic electroluminescent device. The organic electroluminescent device has, as shown in the figure, a transparent electrode 102, a hole-transport layer 103, an electron-transporting luminescent layer 104, and a cathode 105 stacked in sequence on a glass substrate 101. In another configuration, the electron-transporting luminescent layer 105 may be divided by functions into an electron-transport layer and a luminescent layer.

It should be noted that the thin film EL device is defined as a device in which functional layers interposed between the transparent electrode 102 and the cathode 105 are organic layers, inorganic layers, or mixed layers of an organic layer and an inorganic layer. The organic electroluminescent device is defined as a device in which the functional layers interposed between the transparent electrode 102 and the cathode 105 are organic layers.

Here, the cathode 105 utilizes an alloy composed of an alkali metal or an alkaline earth metal which has a low work function and a stable metal such as aluminum or silver, as the cathode with which, electron injection is performed stably and readily. Specific example of the cathode 105 made of the alloy is disclosed, for example, in Japanese Unexamined Patent Publication No. 5-121172. In this publication, it is described that an alloy composed of aluminum and lithium is utilized and the Li concentration is controlled in the trace range from 0.01 wt % to 0.1 wt %. Thereby, an organic electroluminescent device with high electroluminescent efficiency and high environmental stability can be realized.

In relation to the prior art described in the above-described publication, another organic EL device is disclosed which has, in place of the cathode 105, a metal thin film serving as an electron-injecting electrode and an electrode film serving as a passivating electrode stacked in sequence on the organic layer. The metal thin film is composed of a low work function metal material such as an alkali metal or an alkaline earth metal, and the electrode film is composed of a metal material which is stable to oxygen and water. With such a configuration, the electrode film can protect the metal thin film, which has a high reactivity with moisture and the like, from the outside, thereby maintaining electron injection efficiency. Furthermore, since it is not necessary to control Li and the like at low concentrations, device fabrication with simplified processes is made possible.

Moreover, in recent years, an organic electroluminescent device having, as shown in FIG. 17, an electron-injecting layer 106 provided between an electron-transporting luminescent layer 104 and a cathode 105 has been disclosed (Japanese Unexamined Patent Publication No. 9-17574). In this publication, it is disclosed that the electron-injecting layer 106 utilizes an alkali metal compound as the material, and by optimizing the film thickness of the electron-injecting layer 106, light emission with high luminance can be obtained. Furthermore, it is described that because alkali metal compounds are chemically stable, reproducibility of characteristics is high, making it possible to obtain an organic EL device capable of emitting light with high luminance at low applied voltages.

As for an electron-injecting layer composed of an insulating substance, the relationship between the film thickness and a dark spot (a region where there is no light emission) and the like are reported in detail (T. Wakimoto, Y Fukuda, K. Nagayama, A Yokoi, H. Nakada, and M. Tsuchida, IEEE Transactions on Electron Devices, Vol. 44, No. 8, p. 1245, 1997).

The present inventors have developed an organic electroluminescent device which utilizes, as the material for the electron-injecting layer, a specific organic metal complex compound containing an alkali metal or an alkaline earth metal as the central metal, or an electron-deficient compound. With an organic electroluminescent device having the electron-injecting layer utilizing such materials, an electroluminescent device with high luminance and long lifetime can be obtained without the need to use low work function metal materials.

As has been described, in developing the organic electroluminescent device, the electron-injecting layer is a key element in determining electroluminescent efficiencies and lifetimes. From this perspective, various improvements have been made.

When these organic electroluminescent devices are driven under duty drive conditions, for practical application, the instantaneous luminance reaches several thousands to several ten-thousands of $cd/m^2$. Thus, when driving the organic electroluminescent device, it is necessary to maintain high efficiencies even in such a high luminance region. Hence, in prior art organic electroluminescent devices, the luminance needs to be further increased. To realize this, it is indispensable to use an electrode containing an alkali metal or an alkaline earth metal which has an excellent electron injection efficiency.

The electrode utilizing such a low work function metal material, however, may cause degradation in device characteristics due to deterioration of the metal. In order to prevent the degradation, as is described above, a method employing a configuration in which low work function metal compounds are utilized was attempted. With this method, when utilizing inorganic metal compounds, satisfactory improvement was not made in terms of efficiencies and lifetimes. On the other hand, when utilizing organic metal compounds, although some improvement was made in terms of degradation of device characteristics, for achieving further improvement, simple metals with low work function were required to be utilized as the electrode material.

Thus, when low work function simple metals with high reactivity are utilized as the electrode material, deterioration of the simple metals must be prevented.

DISCLOSURE OF THE INVENTION

In view of the foregoing and other problems, it is an object of the present invention to increase, for practical applications, the luminance and lifetime of a thin film EL device, in which a low work function metal with excellent electron injection efficiency is contained in, for example, an electron-injecting electrode, by preventing deterioration of the low work function metal.

The present inventors have investigated the determining factor for the lifetime characteristics of the thin film EL device and then employed the configuration which inhibits the mechanism of the factor. Thereby, the thin film EL device realized a long lifetime while maintaining light emission with high luminance and high reproducibility. In addition, the present inventors have discovered fabrication methods by which thin film EL devices with excellent characteristics can be constantly fabricated, and at the same time high-grade display devices and lighting systems can be provided.

(Electrodes)

(1) According to a first aspect of the present invention, there is provided an electrode comprising: at least two or more different metals having different work functions; and an electron-deficient substance for accepting electrons emitted from a low work function metal, the low work function metal being a metal other than a highest work function metal among the metals.

With the above-described configuration, because an electron-deficient substance is a strong Lewis acid, the substance captures electrons and becomes an anion. This anion can satisfy the octet rule by accepting electrons, and thus a forward reaction is more likely to occur. As a result, the substance can exist stably in the electrode in its anionic state, making it possible to obtain an electrode with excellent electron injection efficiency.

The above-described configuration may further comprise: an electron-deficient substance layer containing the electron-deficient substance; and a metal layer provided on the electron-deficient substance layer and containing an alloy composed of the two or more different metals In addition, the above-described configuration may further comprise: an electron-deficient substance layer containing the electron-deficient substance; a low work function metal layer provided on the electron-deficient substance layer and containing the low work function metal; and a passivating metal layer provided on the low work function metal layer and containing the highest work function metal.

The above-described configuration may further comprise: a low work function metal layer containing the electron-deficient substance and the low work function metal; and a passivating metal layer provided on the low work function metal layer and containing the highest work function metal.

Furthermore, the above-described configuration may be such that an alloy composed of the at least two or more different metals having different work functions and the electron-deficient substance are contained in a same layer.

The electron-deficient substance in each of the above-described configuration may be a compound represented by the following chemical formula (1):

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^3$, $R^4$, $R^5$, and $R^6$ each independently is one selected from the group consisting of hydrogen, alkyl, an aryl derivative, and a derivative of a nitrogen-containing aromatic ring having one nitrogen atom as coordinating atom; and $M^1$ is a central metal.

(2) According to a second aspect of the present invention, there is provided an electrode comprising: at least two or more different metals having different work functions; and a capturing substance for capturing a low work function metal in its ionic state, the low work function metal being a metal other than a highest work function metal among the metals.

When a low work function metal emits electrons and becomes a cation, the cation attempts to fill electrons in the outer shell orbital having lost its valence electrons, which in turn provides a strong oxidizing action to the cation. A capturing substance captures such a low work function metal in its ionic state, and thus it is possible to prevent the low work function metal from becoming an insulator such as an oxide, resulting from reaction with water and the like. Consequently, the lifetime of the electrode can be increased.

The above-described configuration may further comprise: a low work function metal layer provided on the capture layer and containing the low work function metal; and a passivating metal layer provided on the low work function metal layer and containing the highest work function metal.

Furthermore, the above-described configuration may further comprise: a capture layer containing the capturing substance; and a metal layer provided on the capture layer and containing an alloy composed of the two or more different metals.

The above-described configuration may further comprise: a low work function metal layer containing the capturing substance and the low work function metal; and a passivating metal layer provided on the low work function metal layer and containing the highest work function metal.

(3) According to a third aspect of the present invention, there is provided an electrode comprising: at least two or more different metals having different work functions; a capturing substance for capturing a low work function metal in its ionic state, the low work function metal being a metal other than a highest work function metal among the metals; and an electron-deficient substance for accepting electrons emitted from the low work function metal.

With the above-described configuration, since the electrode contains a capturing substance as well as an electron-deficient substance, excellent electron injection efficiency can be achieved and the lifetime can be increased.

The above-described configuration may further comprise: an electron-deficient substance layer containing the electron-deficient substance; a capture layer contacting the electron-deficient substance layer and containing the capturing substance; a low work function metal layer contacting the electron-deficient substance layer or the capture layer and containing the low work function metal; and a passivating metal layer contacting the low work function metal layer and containing the highest work function metal.

In addition, the above-described configuration may further comprise: an electron-deficient substance layer containing the electron-deficient substance; a low work function metal layer provided on the electron-deficient substance layer and containing the capturing substance and the low work function metal; and a passivating metal layer provided on the low work function metal layer and containing the highest work function metal.

(Thin Film EL Devices)

A thin film EL device according to the present invention can employ Aspects (4) to (6), as will be described below. Aspects (1) to (3) respectively correspond to the first to the third aspects described above.

(4) A thin film EL device of the present invention corresponding to the first aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein the electron-injecting electrode contains at least two or more different metals having different work functions and an electron-deficient substance for accepting electrons emitted from a low work function metal, the low work function metal being a metal other than a highest work function metal among the metals.

With the above-described configuration, since the electron-injecting electrode contains an electron-deficient substance with excellent electron transport efficiency, electrons can be efficiently injected into the functional layer. As a result, a thin film EL device with high electroluminescent efficiency can be obtained.

The above-described configuration may be such that the electron-injecting electrode includes: an electron-deficient substance layer provided on the functional layer and containing the electron-deficient substance; and a metal layer provided on the electron-deficient substance layer and containing the at least two or more different metals having different work functions.

Furthermore, the above-described configuration may be such that the electron-deficient substance layer contains the low work function metal.

Another thin film EL device of the present invention corresponding to the first aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein the functional layer contains at least on a side of the electron-injecting electrode an electron-deficient substance for accepting electrons emitted from a low work function metal, the low work function metal being a metal other than a highest work function metal among the metals.

With the above-described configuration, because an electron-deficient substance is contained in the functional layer, it is possible to improve the transport properties of electrons, within the functional layer, injected from the electron-injecting electrode. Thereby, electroluminescent efficiency can be improved.

The above-described configuration may be such that the electron-deficient substance is uniformly contained on a side of the electron-injecting electrode within a given area.

In addition, the above-described configuration may be such that the electron-deficient substance is contained in the functional layer on a side of the electron-injecting electrode within a given area and is distributed such that a concentration thereof gradually increases toward the electron-injecting electrode.

Still another thin film EL device of the present invention corresponding to the first aspect may comprise: an electron-injecting electrode; a hole-injecting electrode paired with the electron-injecting electrode; and a functional layer provided between the electron-injecting electrode and the hole-injecting electrode and emitting light by application of an electric field produced by the electrodes, wherein the functional layer contains a low work function metal and an electron-deficient substance, the low work function metal having a lower work function than the electron-injecting electrode and the electron-deficient substance accepting electrons emitted from the low work function metal.

The above-described configuration may be such that the electron-deficient substance is uniformly contained on a side of the electron-injecting electrode within a given area.

The above-described configuration may be such that the electron-deficient substance is contained in the functional layer on a side of the electron-injecting electrode within a given area and is distributed such that a concentration thereof gradually increases toward the electron-injecting electrode.

(5) A thin film EL device of the present invention corresponding to the second aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein the electron-injecting electrode contains at least two or more different metals having different work functions and a capturing substance for capturing a low work function metal in its ionic state, the low work function metal being a metal other than a highest work function metal among the metals.

With the above-described configuration, a capturing substance captures a low work function metal in its ionic state, thereby inhibiting the low work function metal from becoming an insulator. Consequently, the low work function metal can stably inject electrons over a long period of time. Thus, it is possible to obtain light emission with high luminance and to provide a thin film EL device with a long light-emission lifetime.

The above-described configuration may be such that the electron-injecting electrode includes: a capture layer provided on the functional layer and containing the capturing substance; and a metal layer provided on the capture layer and containing the at least two or more different metals having different work functions.

Furthermore, the above-described configuration may be such that the capture layer contains the low work function metal.

Another thin film EL device of the present invention corresponding to the second aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein the functional layer contains on a side of the electron-injecting electrode a capturing substance for capturing a low work function metal in its ionic state, the low work function metal being a metal other than a highest work function metal among the metals.

As with the above-described configuration, in the case also where a capturing substance is contained in the functional layer, it is possible to inhibit a low work function metal from becoming an insulator, by capturing the low work function metal in its ionic state. As a result, a thin film EL device with high luminance and long lifetime can be provided.

The above-described configuration may be such that the capturing substance is uniformly contained on a side of the electron-injecting electrode within a given area.

Furthermore, the above-described configuration may be such that the capturing substance is contained in the functional layer on a side of the electron-injecting electrode within a given area and is distributed such that a concentration thereof gradually increases toward the electron-injecting electrode.

Still another thin film EL device of the present invention corresponding to the second aspect may comprise: an electron-injecting electrode; a hole-injecting electrode paired with the electron-injecting electrode; and a functional layer provided between the electron-injecting electrode and the hole-injecting electrode and emitting light by application of an electric field produced by the electrodes, wherein the functional layer contains a low work function metal and a capturing substance for capturing the low work function metal in its ionic state, the low work function metal having a lower work function than the electron-injecting electrode.

The above-described configuration may be such that the low work function metal and the capturing substance are uniformly contained on a side of the electron-injecting electrode within a given area.

In addition, the above-described configuration may be such that the low work function metal and the capturing substance are contained in the functional layer on a side of the electron-injecting electrode within a given area and are distributed such that concentrations thereof gradually increase toward the electron-injecting electrode.

(6) A thin film EL device of the present invention corresponding to the third aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein the electron-injecting electrode contains: at least two or more different metals having different work functions; an electron-deficient substance for accepting electrons emitted from a low work function metal, the low work function metal being a metal other than a highest work function metal among the metals; and a capturing substance for capturing the low work function metal in its ionic state.

With the above-described configuration, since the electron-injecting electrode contains an electron-deficient substance, the electron injection efficiency to the functional layer is excellent. Thus, electroluminescent efficiency can be improved. In addition, the electron-injecting electrode also contains a capturing substance, and therefore it is possible to prevent a low work function metal from deteriorating and becoming an insulator Hence, it becomes possible to continuously and stably inject electrons into the functional layer, increasing the lifetime of the device.

The above-described configuration may be such that the electron-injecting electrode includes: an electron-deficient substance layer containing the electron-deficient substance; a capture layer contacting the electron-deficient substance layer and containing the capturing substance; and a metal layer containing the two or more different metals.

The above-described configuration may be such that the electron-injecting electrode includes: an electron-deficient substance layer containing the electron-deficient substance; and a capture layer contacting the electron-deficient substance layer and containing the capturing substance and the low work function metal.

Another thin film EL device of the present invention corresponding to the third aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein the functional layer contains an electron-deficient substance for accepting electrons emitted from a low work function metal and a capturing substance for capturing the low work function metal in its ionic state, the low work function metal being a metal other than a highest work function metal among the metals.

As with the above-described configuration, in the case also where an electron-deficient substance and a capturing substance are contained in the functional layer, it is possible to improve electroluminescent efficiency and increase the luminance and lifetime of the device.

The above-described configuration may be such that the electron-deficient substance and the capturing substance are uniformly contained on a side of the electron-injecting electrode within a given area.

The above-described configuration may be such that the electron-deficient substance and the capturing substance are contained in the functional layer on a side of the electron-injecting electrode within a given area and are distributed such that concentrations thereof gradually increase toward the electron-injecting electrode.

Moreover, still another thin film EL device of the present invention corresponding to the third aspect may comprise: an electron-injecting electrode; a hole-injecting electrode paired with the electron-injecting electrode; and a functional layer provided between the electron-injecting electrode and the hole-injecting electrode and emitting light by application of an electric field produced by the electrodes, wherein the functional layer contains a low work function metal having a lower work function than the electron-injecting electrode, a capturing substance for capturing the low work function metal in its ionic state, and an electron-deficient substance for accepting electrons emitted from the low work function metal The above-described configuration may be such that the low work function metal, the electron-deficient substance, and the capturing substance are uniformly contained on a side of the electron-injecting electrode within a given area.

In addition, the above-described configuration may be such that the low work function metal, the electron-deficient substance, and the capturing substance are contained in the functional layer on a side of the electron-injecting electrode within a given area and are distributed such that concentrations thereof gradually increase toward the electron-injecting electrode.

Furthermore, yet another thin film EL device of the present invention corresponding to the third aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein one of an electron-deficient substance for accepting electrons emitted from a low work function metal and a capturing substance for capturing the low work function metal in its ionic state is contained in the electron-injecting electrode and the other is contained in the functional layer, the low work function metal being a metal other than a highest work function metal among the metals (Methods of Fabricating Thin Film EL Devices)

As the methods of fabricating the above-described thin film EL devices, Aspects (7) to (9), as will be described below, can be employed. Aspects (7) to (9) respectively correspond to Aspects (4) to (6) described above.

(7) A method of fabricating a thin film EL device of the present invention corresponding to the first aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming on a side of the functional layer an electron-deficient substance layer containing an electron-deficient substance for accepting electrons emitted from a low work function metal, the low work function metal being a metal other than a highest work function metal among the metals; and forming on an opposite side from the functional layer a metal layer containing the two or more different metals.

Another method of fabricating a thin film EL device of the present invention corresponding to the first aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming on a side of the functional layer an electron-deficient substance layer containing a low work function metal and an electron-deficient substance for accepting electrons emitted from the low work function metal, the low work function metal being a metal other than a highest work function metal among the metals.

Still another method of fabricating a thin film EL device of the present invention corresponding to the first aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the functional layer so that an electron-deficient substance is distributed in the functional layer at least on a side of the electron-injecting electrode, the electron-deficient substance accepting electrons emitted from a low work function metal, the low work function meal being a metal other than a highest work function metal among the metals.

Yet another method of fabricating a thin film EL device of the present invention corresponding to the first aspect is a method of fabricating a thin film EL device having an electron-injecting electrode, a hole-injecting electrode, and a functional layer provided between the electrodes for emitting light by application of an electric field produced by the electrodes, and the method may comprise: forming the functional layer so that a low work function metal and an electron-deficient substance are distributed in the functional layer at least on a side of the electron-injecting electrode, the low work function metal being a metal other than a highest work function metal among the metals and the electron-deficient substance accepting electrons emitted from the low work function metal.

With the above-described methods, deterioration of a low work function metal can be prevented, and thus it is possible to fabricate a thin film EL device with high light-emission luminance. In addition, when the electron-injecting electrode is formed, for example, from an electron-deficient substance layer and a metal layer containing a low work function metal, the film thickness of the metal layer can be made even thinner, improving workability. Further, variations in light-emission luminance in the plane can be controlled, and thus it is possible to fabricate a device with good reproducibility and to enhance reliability of the fabrication process. Yield can also be improved.

(8) A method of fabricating a thin film EL device of the present invention corresponding to the second aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming on a side of the functional layer a capture layer containing a capturing substance for capturing a low work function metal in its ionic state, the low work function metal being a metal other than a highest work function metal among the metals; and forming a metal layer on an opposite side from the functional layer, the metal layer containing an alloy composed of the two or more different metals.

Another method of fabricating a thin film EL device of the present invention corresponding to the second aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming on a side of the functional layer a capture layer containing a capturing substance for capturing a low work function metal in its ionic state, the low work function metal being a metal other than a highest work function metal among the metals.

Still another method of fabricating a thin film EL device of the present invention corresponding to the second aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the functional layer so that a capturing substance is distributed in the functional layer at least on a side of the electron-injecting electrode, the capturing substance capturing a low work function metal in its ionic state, the low work function metal being a metal other than a highest work function metal among the metals.

Yet another method of fabricating a thin film EL device of the present invention corresponding to the second aspect is a method of fabricating a thin film EL device having an electron-injecting electrode, a hole-injecting electrode, and a functional layer provided between the electrodes for emitting light by application of an electric field produced by the electrodes, and the method may comprise: forming the functional layer so that a low work function metal and a capturing substance are distributed in the functional layer at least on a side of the electron-injecting electrode, the low work function metal being a metal other than a highest work function metal among the metals and the capturing substance capturing the low work function metal in its ionic state.

With the above-described methods, because a capturing substance captures a low work function metal having become a cation during the fabrication process, deterioration of the low work function metal can be inhibited. Consequently, it is possible to fabricate a thin film EL device with high light-emission luminance. In addition, when the electron-injecting electrode is formed, for example, from a capture layer and a metal layer containing a low work function metal, the film thickness of the metal layer can be made even thinner. Thereby, workability can be improved. In addition, variations in light-emission luminance in the plane can be controlled, and thus it is possible to fabricate a device with good reproducibility and to enhance reliability of the fabrication process. Further, yield can be improved.

(9) A method of fabricating a thin film EL device of the present invention corresponding to the third aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming an electron-deficient substance layer containing an electron-deficient substance for accepting electrons emitted from a low work function metal, the low work function metal being a metal other than a highest work function metal among the metals; forming a capture layer containing a capturing substance for capturing the low work function metal in its ionic state; and forming a metal layer on the electron-deficient substance layer or the capture layer, the metal layer containing the two or more different metals.

Another method of fabricating a thin film EL device of the present invention corresponding to the third aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming a layer containing a low work function metal, an electron-deficient substance, and a capturing substance, the low work function metal being a metal other than a highest work function metal among the metals, the electron-deficient substance accepting electrons emitted from the low work function metal, and the capturing substance capturing the low work function metal in its ionic state.

Still another method of fabricating a thin film EL device of the present invention corresponding to the third aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the electron-injecting electrode, the forming of the electron-injecting electrode comprising at least: forming an electron-deficient substance layer containing an electron-deficient substance for accepting electrons emitted from a low work function metal, the low work function metal being a metal other than a highest work function metal among the metals; and forming a capture layer containing the low work function metal and a capturing substance for capturing the low work function metal in its ionic state.

Yet another method of fabricating a thin film EL device of the present invention corresponding to the third aspect is a method of fabricating a thin film EL device having an electron-injecting electrode containing at least two or more different metals having different work functions, a hole-injecting electrode, and a functional layer provided between the electrodes for emitting light by application of an electric field produced by the electrodes, and the method may comprise: forming the functional layer so that an electron-deficient substance for accepting electrons emitted from a low work function metal and a capturing substance for capturing the low work function metal in its ionic state are distributed in the functional layer at least on a side of the electron-injecting electrode, the low work function metal being a metal other than a highest work function metal among the metals.

Furthermore, another method of fabricating a thin film EL device of the present invention corresponding to the third aspect is a method of fabricating a thin film EL device having an electron-injecting electrode, a hole-injecting electrode, and a functional layer provided between the electrodes for emitting light by application of an electric field produced by the electrodes, and the method may comprise: forming the functional layer so that a low work function metal, an electron-deficient substance, and a capturing substance are distributed in the functional layer at least on a side of the electron-injecting electrode, the low work function metal being a metal other than a highest work function metal among the metals, the electron-deficient substance accepting electrons emitted from the low work function metal, and the capturing substance capturing the low work function metal in its ionic state.

With the above-described methods, because an electron-deficient substance and a capturing substance prevent deterioration of a low work function metal, a thin film EL device with high light-emission luminance can be fabricated. In addition, improved workability and good reproducibility are achieved, thereby further enhancing reliability of the fabrication process. Moreover, yield can be improved.

A display device according to the present invention can employ Aspects (10) to (12), as will be described below.

Aspects (10) to (12) respectively correspond to the first to the third aspects described above.

(10) A display device of the present invention corresponding to the first aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein the electron-injecting electrode contains an electron-deficient substance for accepting electrons emitted from a low work function metal, the low work function metal being a metal other than a highest work function metal among the metals.

Another display device of the present invention corresponding to the first aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein one of the electron-injecting electrode and the functional layer contains a low work function metal having a lower work function than a metal composing the electron-injecting electrode, and wherein the functional layer contains an electron-deficient substance for accepting electrons emitted from the low work function metal.

(11) A display device of the present invention corresponding to the second aspect may comprise: an electron-injecting electrode containing at least two or more different metals having different work functions; a hole-injecting electrode paired with the electron-injecting electrode; a functional layer provided between the electron-injecting electrode and the hole-injecting electrode and emitting light by application of an electric field produced by the electrodes, wherein the electron-injecting electrode contains a capturing substance for capturing a low work function metal in its ionic state, the low work function metal being a metal other than a highest work function metal among the metals.

Another display device of the present invention corresponding to the second aspect may comprise: a hole-injecting electrode; an electron-injecting electrode paired with the hole-injecting electrode; a functional layer provided between the hole-injecting electrode and the electron-injecting electrode and emitting light by application of an electric field produced by the electrodes, wherein one of the electron-injecting electrode and the functional layer contains a low work function metal having a lower work function than a metal composing the electron-injecting electrode, and wherein the functional layer contains a capturing substance for capturing the low work function metal in its ionic state.

(12) A display device of the present invention corresponding to the third aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein the electron-injecting electrode contains: an electron-deficient substance for accepting electrons emitted from a low work function metal, the low work function metal being a metal other than a highest work function metal among the metals; and a capturing substance for capturing the low work function metal in its ionic state.

Another display device of the present invention corresponding to the third aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein one of the electron-injecting electrode and the functional layer contains a low work function metal having a lower work function than a metal composing the electron-injecting electrode, and wherein the functional layer contains an electron-deficient substance for accepting electrons emitted from a low work function metal and a capturing substance for capturing the low work function metal in its ionic state, the low work function metal being a metal other than a highest work function metal among the metals.

Still another display device of the present invention corresponding to the third aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein one of a capturing substance for capturing a low work function metal in its ionic state and an electron-deficient substance for accepting electrons emitted from the low work function metal is contained in the electron-injecting electrode and the other is contained in the functional layer, the low work function metal being a metal other than a highest work function metal among the metals.

With the above-described configurations, by employing a thin film EL device with high electroluminescent efficiency and high reliability, a high-grade display device can be provided. In addition, even when, for example, the device is driven under duty drive conditions, a high-grade image display can be realized and a reduction in lifetime can be inhibited over a long period of time, ensuring high reliability.

A lighting system according to the present invention can employ Aspects (13) to (15), as will be described below. Aspects (13) to (15) respectively correspond to the first to the third aspects described above.

(13) A lighting system of the present invention corresponding to the first aspect may comprise: an electron-injecting electrode containing at least two or more different metals having different work functions; a hole-injecting electrode paired with the electron-injecting electrode; a functional layer provided between the electron-injecting electrode and the hole-injecting electrode and emitting light by application of an electric field produced by the electrodes, wherein the electron-injecting electrode contains an electron-deficient substance for accepting electrons emitted from a low work function metal, the low work function metal being a metal other than a highest work function metal among the metals.

Another lighting system of the present invention corresponding to the first aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein one of the electron-injecting electrode and the functional layer contains a low work function metal having a lower work function than a metal composing the electron-injecting electrode, and wherein the functional layer contains an electron-deficient substance for accepting electrons emitted from the low work function metal.

(14) A lighting system of the present invention corresponding to the second aspect may comprise: an electron-injecting electrode containing at least two or more different metals having different work functions; a hole-injecting electrode paired with the electron-injecting electrode; a functional layer provided between the electron-injecting electrode and the hole-injecting electrode and emitting light by application of an electric field produced by the electrodes, wherein the electron-injecting electrode contains a capturing substance for capturing a low work function metal in its ionic state, the low work function metal being a metal other than a highest work function metal among the metals.

Another lighting system of the present invention corresponding to the second aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein one of the electron-injecting electrode and the functional layer contains a low work function metal having a lower work function than a metal composing the electron-injecting electrode, and wherein the functional layer contains a capturing substance for capturing the low work function metal in its ionic state.

(15) A lighting system of the present invention corresponding to the third aspect may comprise: an electron-injecting electrode containing at least two or more different metals having different work functions; a hole-injecting electrode paired with the electron-injecting electrode; and a functional layer provided between the electron-injecting electrode and the hole-injecting electrode and emitting light by application of an electric field produced by the electrodes, wherein the electron-injecting electrode contains: an electron-deficient substance for accepting electrons emitted from a low work function metal, the low work function metal being a metal other than a highest work function metal among the metals; and a capturing substance for capturing the low work function metal in its ionic state.

Another lighting system of the present invention corresponding to the third aspect may comprise: a hole-injecting electrode; an electron-injecting electrode paired with the hole-injecting electrode; and a functional layer provided between the hole-injecting electrode and the electron-injecting electrode and emitting light by application of an electric field produced by the electrodes, wherein one of the electron-injecting electrode and the functional layer contains a low work function metal having a lower work function than a metal composing the electron-injecting electrode, and wherein the functional layer contains an electron-deficient substance for accepting electrons emitted from a low work function metal and a capturing substance for capturing the low work function metal in its ionic state, the low work function metal being a metal other than a highest work function metal among the metals.

Still another lighting system of the present invention corresponding to the third aspect may comprise: an electron-injecting electrode containing at least two or more different metals having different work functions; a hole-injecting electrode paired with the electron-injecting electrode; a functional layer provided between the electron-injecting electrode and the hole-injecting electrode and emitting light by application of an electric field produced by the electrodes, wherein one of a capturing substance for capturing a low work function metal in its ionic state and an electron-deficient substance for accepting electrons emitted from the low work function metal is contained in the electron-injecting electrode and the other is contained in the functional layer, the low work function metal being a metal other than a highest work function metal among the metals.

With the above-described configurations, planar light emitting, flexible lighting systems can be provided. Consequently, without bringing about a conventional loss of luminance in indirect lighting and the like, new lighting systems can be provided and new lighting space can be created.

BRIEF DESCRIPTION OF THE DRAWINGS

Other objects, features, and advantages of the present invention will be understood upon review of the following description. In addition, the benefits of the present invention will become apparent from the following description taken in conjunction with the accompanying drawings.

FIG. 5(a) shows a state in which an electron-deficient substance is uniformly distributed in a functional layer and FIG. 5(b) shows a state in which an electron-deficient substance is distributed in a functional layer with a concentration gradient.

FIG. 11(a) shows a state in which an ion capturing substance is uniformly distributed in a functional layer and FIG. 11(b) shows a state in which an ion capturing substance is distributed in a functional layer with a concentration gradient.

BEST MODE FOR CARRYING OUT THE INVENTION

Embodiments of the present invention are described below.

Embodiment 1

Figure 1:
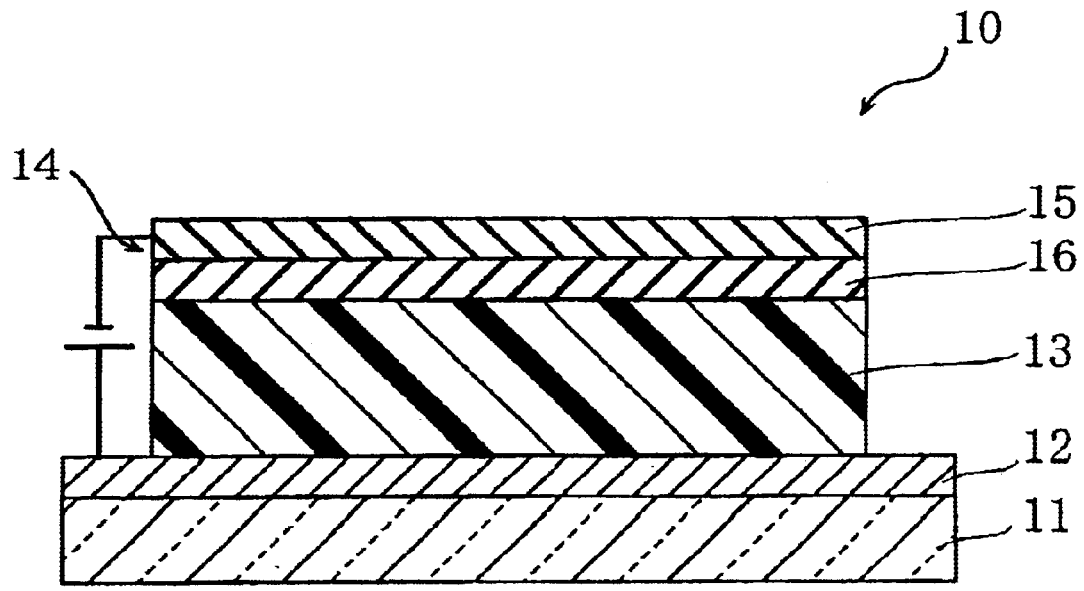
FIG. 1 is a schematic cross-sectional view showing a thin film EL device according to Embodiment 1 of the present invention.

An embodiment of a thin film EL device according to the present invention is described below. FIG. 1 is a schematic cross-sectional view showing a thin film EL device according to Embodiment 1.

As shown in the figure, a thin film EL device 10 according to the present embodiment has at least a hole-injecting electrode 12, an electron-injecting electrode 14 paired with the hole-injecting electrode 12, and a functional layer 13 provided between the hole-injecting electrode 12 and the electron-injecting electrode 14, stacked on top of each other on a substrate 11.

The substrate 11 can be anything that can support the above-described hole-injecting electrode 12 and the like. In addition, in the case where light emitted from the functional layer 13 is extracted from the side of the substrate 11, the substrate should have transparency or translucency to visible light. Examples of such a substrate include a glass substrate, such as, for example, Corning 1737 (trade name, available from Corning Incorporated), and a resin film substrate such as polyester.

The hole-injecting electrode 12 is an electrode that functions to inject holes into the functional layer 14. When light emitted from the functional layer 14 is extracted from the side of the substrate 11, the hole-injecting electrode 12 needs to have transparency or translucency. In such a case, an ITO (indium tin oxide) film, for example, can be utilized as the hole-injecting electrode 12. In addition to ITO, SnO (tin oxide), Ni (nickel), Au (gold), Pt (platinum), Pd (palladium) or the like can also be utilized.

The film thickness of the hole-injecting electrode 12 is determined by the required sheet resistance and visible light transmittance. It should be noted, however, that the thin film EL device has a higher driving current density than, for example, the liquid crystal display device, and thus it is preferable that the sheet resistance be low. For this reason, the hole-injecting electrode 12 is often used with a film thickness of 100 nm or more.

The main function of the functional layer 13 is to emit light by application of an electric field. The functional layer 13 may be composed of a single luminescent layer or may have a multilayer structure composed of a plurality of layers stacked on top of each other so as to divide functions. In the case of the multilayer structure, a thin film EL device according to the present invention can employ various configurations. In the following description, an example is provided that shows a case where a hole-transport layer, a luminescent layer, and an electron-transport layer are stacked in this order from the side of the substrate 11.

The hole-transport layer functions to receive holes from the hole-injecting electrode 12 and transport the holes to the luminescent layer. In addition, the hole-transport layer functions to hinder electron passage. Materials used for the hole-transport layer include: for example, tetraphenylbenzidine compounds, triphenylamine trimers, and benzidine dimmers, disclosed in Japanese Unexamined Patent Publication No. 7-126615; various triphenyl diamine derivatives disclosed in Japanese Unexamined Patent Publication No. 8-48656; N,N'-diphenyl-N,N'-bis(3-methylphenyl)-1,1'-biphenyl-4,4'-diamine (MTPD) disclosed in Japanese Unexamined Patent Publication No. 7-65958; and triphenylamine tetramers disclosed in Japanese Unexamined Patent Publication No. 10-228982. Further, of these materials exemplified, derivatives having triphenylamine as the basic skeleton are preferable, and in particular, triphenylamine tetramers are more preferable.

The electron-transport layer functions to receive electrons from the electron-injecting electrode 14 and transport the electrons to the luminescent layer. In addition, the electron-transport layer functions to hinder hole passage. For materials used for the electron-transport layer, for example, tris(8-quinolinolato)aluminum (hereinafter referred to as Alq) is preferable. In addition to Alq, other examples include metal complexes, such as tris(4-methyl-8-quinolinolato) aluminum, 3-(2'-benzothiazolyl)-7-diethylaminocoumarin, and the like. It should be noted that as materials for the hole-transport layer and the electron-transport layer, inorganic materials that form a p-layer or an n-layer can also be employed in addition to the organic materials listed above.

The film thicknesses of the hole-transport layer and the electron-transport layer are preferably in the range of 10 to 1000 nm. In addition, each of these layers can be composed of a plurality of layers. That is, when the hole-transport layer is formed from a plurality of layers, the layers can be stacked such that the ionization potential gradually decreases toward the luminescent layer. When the electron-transport layer is formed from a plurality of layers, the layers can be stacked such that the electron affinity gradually increases toward the luminescent layer.

The luminescent layer is a layer in which holes injected from the hole-transport layer and electrons injected from the electron-transport layer are combined together and the combined energy is emitted as light. Examples of the luminescent layer include a hole-transporting luminescent layer, an electron-transporting luminescent layer, a bipolar luminescent layer, and the like. For materials used for the luminescent layer, in addition to the above-described Alq or its derivatives, it is also possible to use one in which compounds such as Alq or its derivatives are doped with a dye such as coumarin 6, DCM (4-dicyanomethylene-2-methyl-6-(p-dimethylaminostyryl)-4H-pyran), or phenoxazone 9. Further, one in which triphenylamine is doped with rublene can also be employed. Moreover, in addition to the above-described organic materials, inorganic fluorescent materials can also be used. When using inorganic fluorescent materials, for example, an inorganic fluorescent material is dispersed in a polymer matrix and the dispersion is coated, thereby forming a layer.

In the foregoing, the functional layer 13 was described, as an example, for the case of a multilayer structure consisting of the hole-transport/luminescent/electron-transport layers; however, the present invention is not limited thereto. For example, a multilayer structure consisting of the luminescent/electron-transport or hole-transport/luminescent layers or a multilayer structure consisting of the hole-transport/carrier-blocking/electron-transport layers may be employed. Further, it is also possible to employ a multilayer structure in which a hole-blocking layer such as bathocuproine is stacked between a hole-transport layer and an electron-transport layer so that the hole-transport layer emits light. In addition, the functional layer may be composed of a single luminescent layer.

As for the layers composing the functional layer 13, such as the hole-transport layer, the electron-transport layer, and the luminescent layer, it is preferable that each layer have an amorphous and homogeneous film structure. This is because when the film structure is crystallized, it becomes necessary to increase the driving voltage of the device, and at the same time the injection efficiency of charge carriers is reduced, causing degradation of the device characteristics.

The electron-injecting electrode 14 is formed from a metal layer 15 containing at least two or more different metals having different work functions and an electron-deficient substance layer 16 containing an electron-deficient substance and has a basic function of injecting electrons into the functional layer 13.

The metal layer 15 can be composed, for example, of an alloy composed of a metal with a low work function and a low electron injection barrier and a stable metal with a higher work function than the foregoing metal. In addition, the metal layer may be a multilayer electrode, which will be described later, having a plurality of metal films stacked on top of each other.

Examples of the alloy include an Mg—Ag alloy proposed by Tang et al., an Al—Li alloy and the like. In addition, it is also possible to employ a Ca—Ag alloy, an Li—Al—Zn alloy, a Ca—Al alloy, an Mg—Al alloy, an Sn—Al—Li alloy, a Bi—Al—Li alloy, an In—Al—Li alloy, and the like. The above-described metal with a low work function (low work function metal) indicates a metal that has a relatively low work function as compared with the above-described stable metal. Specifically, alkali metals including Li, Na, K, Rb, Cs, and Fr, alkaline earth metals including Be, Mg, Ca, Sr, Ba, and Ra, and the like are preferable. These low work function metals have a tendency to readily emit electrons and therefore electron can be injected into the inside the luminescent layer extremely readily, making it possible to increase the luminance of the thin film EL device. It should be noted that electrons emitted from the low work function metal are valence electrons in the outermost shell; for example, in an alkali metal such as Li, electrons in the 2s orbital are emitted, and in an alkaline earth metal such as Na, electrons in the 3s orbital are emitted, and thus the low work function metal becomes a cation (positive ion).

Moreover, the electron-injecting electrode 14 contains a metal having a higher work function than the low work function metal. The metal with a higher work function serves to protect and prevent the low work function metal from deteriorating. The low work function metal has a high reactivity with moisture, oxygen, and the like, and thus by allowing the low work function metal to form an alloy with a more stable metal, the low work function metal can be protected from moisture and the like in the air. As a result, electrons can be stably injected into the functional layer 13. Here, examples of metals with high work functions include Al, Zn, Ag, In, Sn, Bi, Pd, Cu, and the like.

The electron-deficient substance layer 16 contains at least an electron-deficient substance. The electron-deficient substance is a substance that is deficient in the number of valence electrons compared to the number of valence orbitals. For the electron-deficient substance, it is possible to utilize various electron-deficient organic metal compounds or electron-deficient inorganic metal compounds, obtained as a result of multicenter bonding between an atom, which easily composes an electron-deficient substance such as Li, Be, Mg, B, Zn, and Al, and another atom.

Examples of the electron-deficient organic metal compounds include alkylated Al which is stabilized with 3-center-2-electron bonds being formed and a compound represented by the following chemical formula (1).

(1)

The $R^1$ and $R^2$ each independently is a bridging ligand containing a nitrogen-containing aromatic ring or its derivative which has at least one nitrogen atom as coordinating atom, halogen, or a bridging ligand containing alkyl of 1 to 3 carbons. In the bridging ligand containing a nitrogen-containing aromatic ring which has at least one nitrogen atom, examples of the bridging ligand containing a nitrogen-containing aromatic ring which has one nitrogen atom include pyrrole, pyridine, oxazole, 3,3'-bipyridine-5,5'-diyl, and the like. In addition, examples of the bridging ligand containing a nitrogen-containing aromatic ring which has two or more nitrogen atoms include imidazole, pyrazole, pyridazine, pyrazine, pyrimidine, phthalazine, 1H-indazole, oxadiazole, 9,10-phenanthroline, triazole, triazine, tetrazine, tetrazole, and the like. Further, examples of the halogen include F, Cl, Br, I, and At. Moreover, examples of the bridging ligand containing alkyl of 1 to 3 carbons include methyl, ethyl, and butyl.

The $R^3$, $R^4$, $R^5$, and $R^6$ are each independently is one selected from the group consisting of hydrogen, alkyl, an aryl derivative, and a derivative of a nitrogen-containing aromatic ring that contains one nitrogen atom as coordinating atom, and examples of the alkyl include methyl, ethyl, and the like. In addition, examples of the aryl derivative include phenyl, tolyl, pyridyl, triazole, tetrazole, indazole, and the like. Further, examples of the derivative of a nitrogen-containing aromatic ring include pyrrole, indole, isoindole, carbazole, and the like. The $M^1$ is a metallic or semi-metallic element selected from a group of atoms consisting of Be, Mg, Ca, B, Al, and Ga.

Specific examples of compounds represented by the chemical formula (1) include 4,4,8,8-tetraethylpyrazabole, 1,3,5,7-tetramethylpyrazabole, pyrazabole, and the like.

Examples of electron-deficient inorganic metal compounds include LiH, BeH$_2$, and the like. Particularly, in the case where the functional layer 13 which contacts with the cathode is composed of an organic compound, the above-described organic metal complex compounds are preferable.

These electron-deficient substances have not completed a closed shell and therefore have strong electron-accepting properties and excellent electron transport properties. Thus, in the prior art, electron-deficient substances were sometimes used as electron-injecting material, without using low work function metals.

For reference, it should be noted that at the present time, for the description of the bonds between neutral molecules, the Lewis-Langmuir's theory of valency and the octet theory are utilized, but as for the electron-deficient substance, it is difficult to describe the bonding state by applying such theories However, by a theory in which molecular orbitals are formed from the combination of some atomic orbitals, electron-deficient substances can be described easily. A more detailed description of electron-deficient substances is provided in inorganic chemistry books, dictionaries of physics and chemistry, and so forth.

The idea of providing in the electron-injecting electrode 14 the electron-deficient substance layer 16 containing an electron-deficient substance such as those described above came about from the deterioration mechanism of low work function metals, which will be described below, investigated by the present inventors.

Using Li as an example of a low work function metal, the deterioration control mechanism of low work function metals is described. First, Li which is contained in the electron-injecting electrode 14 emits electron(s) and becomes an Li cation, as is shown in the following reaction formula (3).

$$Li \leftrightarrows Li^+ + e^- \qquad (3)$$

When the reaction formula (3) performs electron transfer continuously and reversibly, Li deterioration essentially does not occur. The Li cation, however, is highly reactive and has a strong oxidizing action. Thus, the Li cation easily reacts, at its formation, with nitrogen and the like present in the device or in the storage environment of the device. That is, a nitride (insulator) of Li is formed and thus the reaction formula (3) becomes irreversible. Consequently, a stable electron-injection function to the functional layer 13 is reduced, bringing about device degradation.

On the other hand, when electrons are injected into the electron-deficient substance layer 16 from the metal layer 15, because an electron-deficient substance is a strong Lewis acid, the electrons are captured by the electron-deficient substance. Thereby, an anion $(A^-)$ is formed.

$$A + e^- \leftrightarrows A^- \qquad (4)$$

In the above formula, A represents an electron-deficient substance.

Here, because $A^-$ can satisfy the octet rule by accepting electrons, a forward reaction is more likely to occur. Hence, the substance can exist continuously and stably in its anionic state. Consequently, the electron-deficient substance layer 16 containing an electron-deficient substance functions as a layer having an extremely excellent electron transport property, making it possible to inject more electrons into the luminescent layer. Thereby, the recombination rate of holes and electrons is increased, improving electroluminescent efficiency.

Furthermore, the $A^-$ acts as a weak Lewis base to the Li cation, and thus a reaction represented by the following reaction formula (5) occurs at the boundary between the electron-injecting electrode 14 and the electron-deficient substance layer 16, thereby forming complexes. In addition, because part of the Li cations enter into the electron-deficient substance layer 16 by ablation, a reaction occurs even inside the electron-deficient substance layer 16.

$$A + Li^+ \leftrightarrows [A^- Li^+] \qquad (5)$$

Next, the substance is further transferred from an ion complex-like intermediate to a neutral molecule of a Lewis acid (A) and Li. In other words, the electron-deficient substance prevents the low work function metal from changing into an oxide, a nitride, or the like, and thus high electron injection efficiency of the electron-injecting electrode 14 can be maintained. Consequently, while light emission with high luminance is realized, the lifetime of the device can be increased.

The average film thickness of the electron-deficient substance layer 16 is preferably in the range of 0.1 to 100 nm. This is because when the electron-deficient substance layer is in a monolayer structure having a substantially uniform film thickness, the film thickness, thought it varies with the type of the electron-deficient substance, results in on the order of 0.1 nm or more, making it difficult to form the electron-deficient substance layer 16 having a film thickness smaller than that. On the other hand, a film thickness of greater than 100 nm increases the applied voltage, bringing about device degradation, and thus is not desirable.

Now, a fabrication method of a thin film EL device according to Embodiment 1 is described.

First, on a substrate 11, a hole-injecting electrode 12 is formed in a conventional manner. Specifically, when, for example, the hole-injecting electrode 12 is an ITO film, film-forming techniques such as sputtering, electron beam evaporation, or ion plating can be employed. These film-forming techniques allow improvement in transparency of the ITO film and reduction in resistivity.

Subsequently, on the electron-injecting electrode 14, a functional layer 13 is formed. The functional layer can employ various configurations as discussed earlier. For example, when forming a hole-transport layer, a luminescent layer, and an electron-transport layer in this order from the side of the functional layer 13, it is preferable to employ vacuum vapor deposition as the film-forming technique for the layers. With this technique, formation of an amorphous and homogeneous thin film is made possible. Further, when the layers are formed continuously in vacuum, it is possible to prevent impurities from adhering to the boundaries between the layers. Consequently, improvement of characteristics such as a reduction in operating voltage, an increase in efficiency, and an increase in lifetime can be achieved. In addition, in forming these layers by vacuum vapor deposition, when any of the layers contains a plurality of compounds, it is preferable that boats (containers filled with parent materials for deposition), having therein each compound, be co-deposited as individually controlling the temperatures. It is also possible to deposit a mixture in which these compounds are mixed together in advance. Further, for other film-forming techniques than the vacuum vapor deposition, it is also possible to employ solution coating techniques such as spin coating, dipping, and casing, Langmuir-Blodgett (LB) technique, and the like. In the case of the solution coating techniques, such techniques may be performed by dispersing each compound in a matrix substance such as polymer.

Next, on the functional layer 13, an electron-deficient substance layer 16 is formed by vacuum vapor deposition. Deposition conditions are not particularly limited and thus are appropriately set so that a desired thin film is formed. Specifically, when depositing under conditions, for example, where the deposition rate is 0.01 to 0.5 nm/sec and the vacuum pressure is $10^3$ to $10^6$ Pa, the electron-deficient substance layer 16 with a good film structure can be formed.

Subsequently, on the electron-deficient substance layer 16, a metal layer 15 is formed, for example, by deposition or sputtering. At this point, a low work function metal is changed into an oxide, a nitride, or the like during the formation process of the metal layer 15, that is, the deterioration of the metal is already underway at the beginning of the device fabrication process. Due to this, conventional devices had lower light-emission luminance than the theoretically predicted value.

However, in the present embodiment, since the metal layer 15 is formed on the electron-deficient substance layer 16, the deterioration of the low work function metal can be prevented. A more detailed description is as follows. The low work function metal emits electrons and becomes a cation even during the film formation process. The emitted electrons are accepted by the electron-deficient substance, thereby forming an anion of the electron-deficient substance. The anion, before the cation is changed into an oxide or the like by reacting with water, oxygen, or the like, performs electron transfer with the cation and as a result, charge transfer occurs. Thereby, the low work function metal returns to the ground state, which in turn inhibits the low work function metal from changing into an oxide or the like and deteriorating. This enables the formation of the metal layer 15 containing very few oxides or the like, allowing the device to emit light with high luminance.

Furthermore, as described above, the deterioration of the low work function metal can be prevented, and thus it is also possible to make the film thickness of the metal layer 15 even thinner. Consequently, good workability is achieved. In addition, variations in light-emission luminance in the plane can be controlled, and thus it is possible to fabricate a device with good reproducibility and to improve yield.

Thus, with the fabrication method of a thin film EL device according to Embodiment 1, a thin film EL device with extremely high light-emission luminance compared with a conventional thin film EL device can be fabricated with good workability and good reproducibility.

When a thin film EL device has a pn junction, the thin film EL device has an electromotive force, and therefore even in a state where electricity is not turned on, electron transfer is performed in the device. Hence, it can be assumed that even in a storing state with no load, the reactions of the above-described reaction formulae (3) to (5) are proceeded. Further, the reactions of the reaction formulae (3) to (5) occur even in the fabrication process of the thin film EL device having a pn junction. Thus, in this case too, a thin film EL device with high light-emission luminance can be fabricated with good workability and reproducibility, while improving yield.

Figure 2:
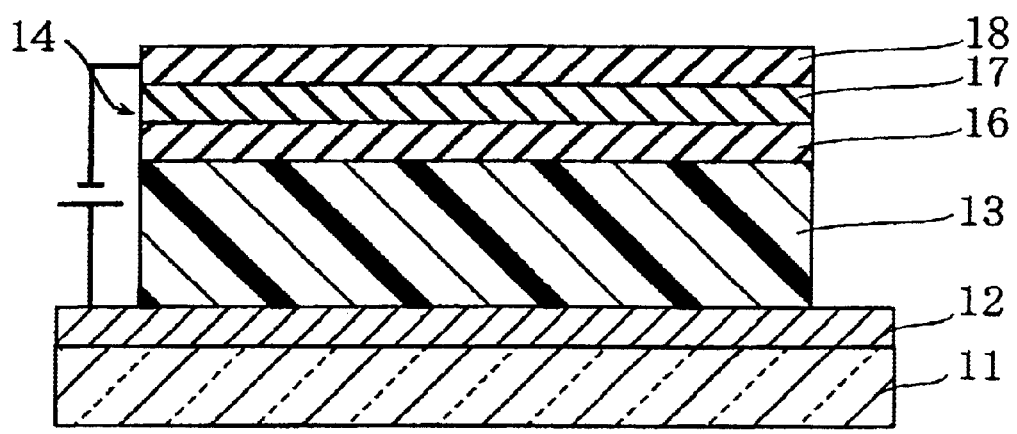
FIG. 2 is a schematic cross-sectional view showing another thin film EL device according to Embodiment 1 of the present invention.

It should be noted that in the present embodiment the electron-injecting electrode 14 was described, as an example, for the case where the electrode is formed from the metal layer 15 containing an alloy and the electron-deficient substance layer 16, but the present invention is not limited thereto. For example, as shown in FIG. 2, an electron-injecting electrode 14 may be a multilayer electrode having an electron-deficient substance layer 16, a low work function metal layer 17 containing a low work function metal, and a passivating metal layer 18 containing a metal with a higher work function than the low work function metal, stacked in this order from the side of a functional layer 13. In this case, the low work function metal layer 17 and the passivating metal layer 18 can be formed by deposition, sputtering, or the like.

Figure 3:
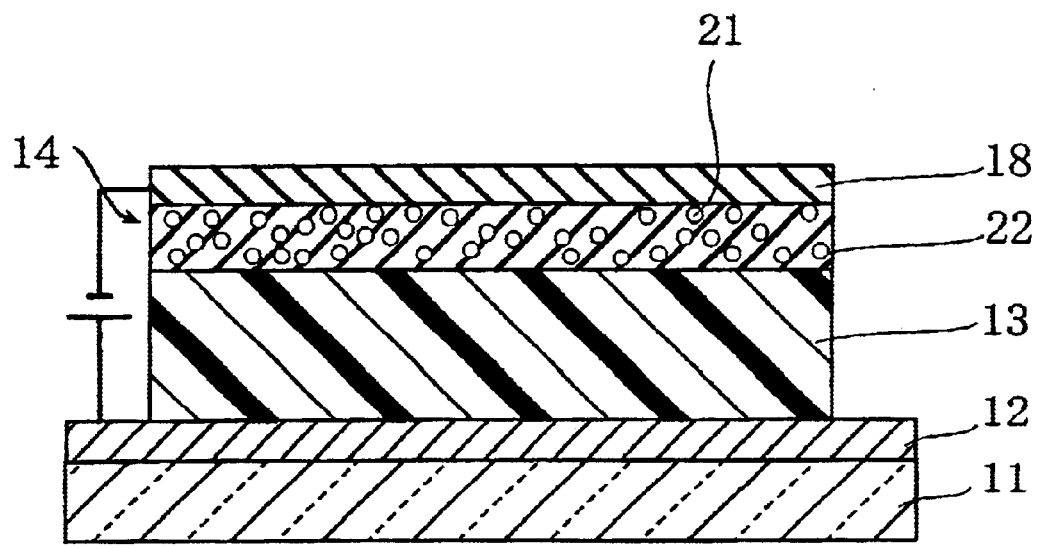
FIG. 3 is a schematic cross-sectional view showing still another thin film EL device according to Embodiment 1 of the present invention.

Furthermore, as shown in FIG. 3, an electron-injecting electrode 14 may be a multilayer electrode having an electron-deficient substance layer 16 containing a low work function metal 21 and a passivating metal layer 18, stacked in this order from the side of a functional layer 13. In this case, the film thickness of the electron-deficient substance layer 16 is preferably in the range of 0.1 to 1000 nm. This is because when the electron-deficient substance layer 16 is in a monolayer structure having a substantially uniform film thickness, the film thickness, though it varies with the type and content of the electron-deficient substance, results in on the order of 0.1 nm or more, making it difficult to form the electron-deficient substance layer 16 having a film thickness smaller than that. On the other hand, a film thickness of greater than 1000 nm increases the applied voltage, bringing about device degradation, and thus is not desirable. Further, the concentration of the electron-deficient substance should be in the range of 30 to 99 mol %. A concentration of 30 mol % or less is not desirable because with such a concentration the electron transport property cannot be sufficiently improved and the deterioration of the low work function metal cannot be prevented On the other hand, a concentration of 99 mol % or more relatively reduces the ratio of the low work function metal, reducing the amount of electrons to be injected, and thus is not desirable. The electron-deficient substance layer 16 can be formed by co-depositing an electron-deficient substance and a low work function metal. A passivating metal layer 18 can be formed by deposition, sputtering, or the like, as the above-described case.

Figure 4:
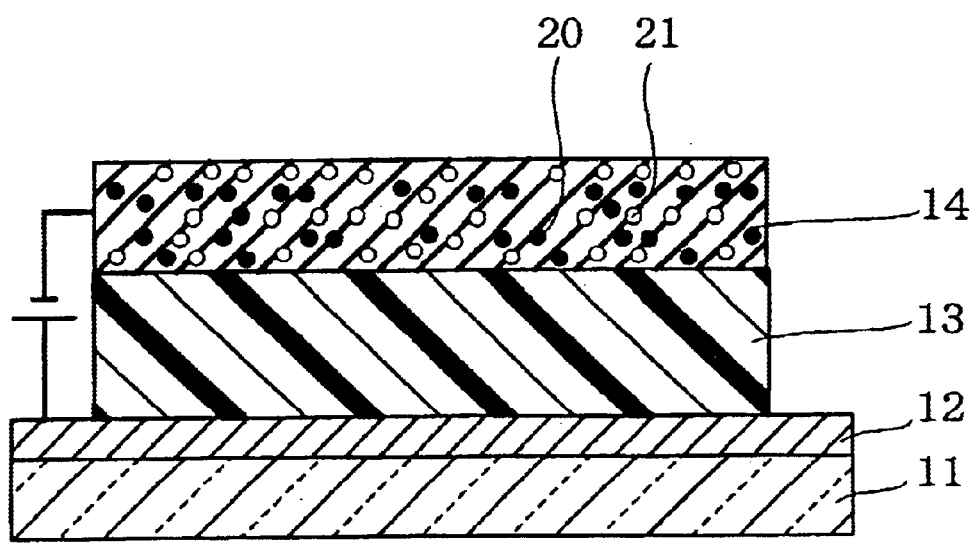
FIG. 4 is a schematic cross-sectional view showing yet another thin film EL device according to Embodiment 1 of the present invention.

Moreover, as shown in FIG. 4, an electron-injecting electrode 14 may be a single layer containing an electron-deficient substance 20, a low work function metal 21, and a metal with a higher work function than the low work function metal 21. In this case, as the film-forming technique for the electron-injecting electrode 14, co-deposition can be employed.

It should be noted that in the present embodiment the electron-deficient substance layer 16 was described, as an example, for the case of a multilayer structure, but the present invention is not limited thereto. For example, in a thin film EL device shown in FIG. 1, an electron-deficient substance layer can be provided in an island configuration between the functional layer 13 and the metal layer 15. In addition, in a thin film EL device shown in FIG. 2, an electron-deficient substance layer can be provided in an island configuration between the functional layer 13 and the low work function metal layer 17. Even with these configurations, it is possible to inhibit deterioration of the low work function metal and to improve the light-emission lifetime of the device.

Embodiment 2

Another embodiment of a thin film EL device according to the present invention is described below. It should be noted that the components having the same functions as those of the thin film EL device of Embodiment 1 are designated by the same reference numerals and thus will not be further described.

Thin film EL devices according to Embodiment 2 are different from thin film EL devices according to Embodiment 1 in that an electron-deficient substance is contained in the functional layer but not in the electron-injecting electrode.

Figure 5A:
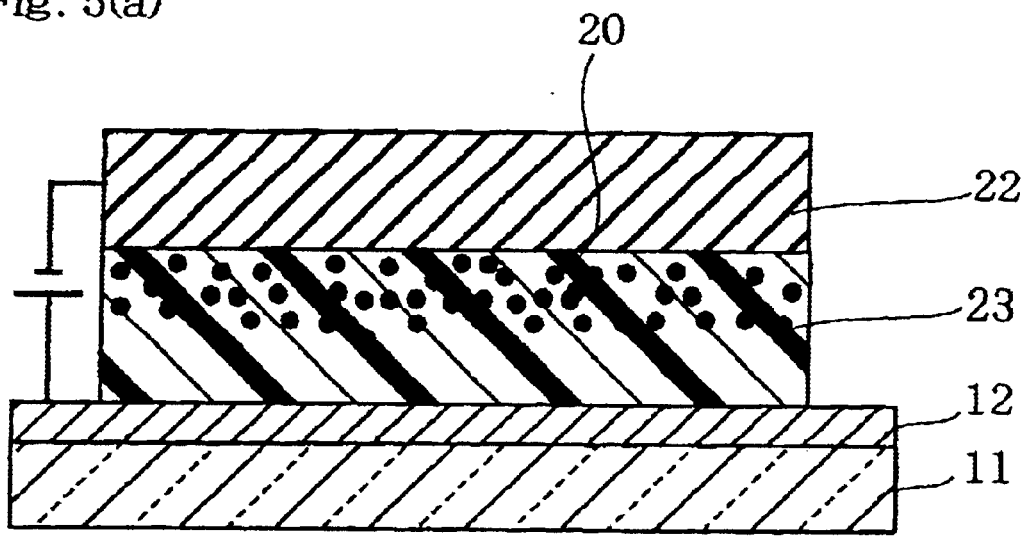
FIGS. 5(a) and 5(b) are schematic cross-sectional views each showing a thin film EL device according to Embodiment 2 of the present invention.

FIG. 5(*a*) is a cross-sectional view schematically showing a thin film EL device according to Embodiment 2 and shows a state in which an electron-deficient substance is distributed in a functional layer. An electron-injecting electrode 22 shown in the figure is a metal layer containing an alloy composed of at least two or more different metals having different work functions. In addition, a functional layer 23 basically has the same function as the functional layer according to Embodiment 1, but in the present embodiment, the functional layer further contains an electron-deficient substance 20. The electron-deficient substance 20 is distributed in the functional layer 23 on the side of the electron-injecting electrode 22. The area where the electron-deficient substance 20 is present should be within about two-thirds of the film thickness of the functional layer 23 from the boundary between the electron-injecting electrode 22 and the functional layer 23. Here, the film thickness of the functional layer 23 is, for example, 50 to 1000 nm. It should be noted that the electron-deficient substance 20 may be uniformly distributed throughout the functional layer 23.

When, for example, the functional layer is formed from a hole-transport layer, a luminescent layer, and an electron-transport layer, stacked in this order from the hole-injecting electrode side, an electron-deficient substance 20 is contained at least in the electron-transport layer. In the electron-transport layer, anionic (radical) molecules are continuously formed by electron transfer between adjacent molecules, and the electrons are transported hopping in the layer. Meanwhile, in the case of conventionally-used electron transport materials, the stability is high in the ground state and therefore even if the materials accept electrons and fall into an anionic (radical) state, the materials quickly returns to the ground state. That is, a reverse reaction in which electrons are emitted is likely to occur. On the contrary, anions formed from an electron-deficient substance can satisfy the octet rule by accepting more electrons and thus a forward reaction is likely to occur. Thereby, the substance can exist continuously and stably in its anionic state. As can be seen from this, the electron-deficient substance has an extremely excellent electron transport property, resulting in a good electron transport to the functional layer 23. Consequently, the device can emit light with high luminance, and at the same time electroluminescent efficiency can be improved.

Figure 5B:
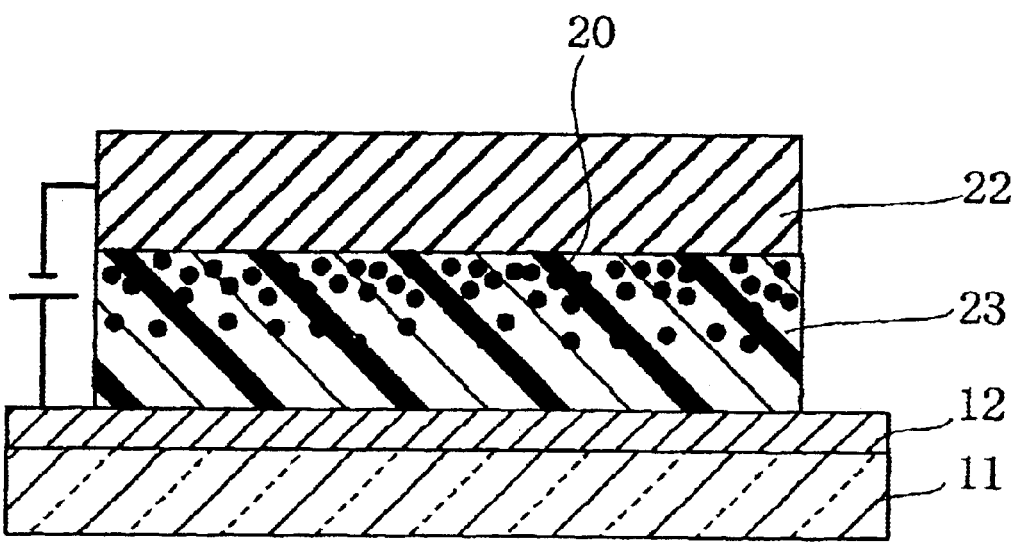

It is also possible to distribute an electron-deficient substance 20 in the functional layer such that, as shown in FIG. 5(b), the concentration of the substance gradually increases toward an electron-injecting electrode 22. The reaction between the anions (A−) of the electron-deficient substance and the cations of the low work function metal occur more frequently at the boundary between the functional layer 23 and the electron-injecting electrode 22. Though part of the cations enter into the functional layer 23 by ablation, because the number of the cations gradually decreases toward the center of the functional layer 23, the frequency of the reaction between the anions of the electron-deficient substance and the cations decreases accordingly. Thus, when a concentration gradient is established, as in the above-described configuration, electrons can be efficiently donated to the cations of the low work function metal.

The concentration of the electron-deficient substance 20 is preferably in the range from 0.1 mol % to 99.9 mol %. When the concentration is less than 0.1 mol %, the electron transport property cannot be improved. On the other hand, when the concentration is greater than 99.9 mol %, the layer becomes extremely close to a single layer composed of an electron-deficient substance, and as a result, the functional layer 23 cannot fully exert the light-emitting function. Further, in the case where the electron-deficient substance 20 is uniformly distributed in the functional layer within a given area from the boundary between the functional layer 23 and the electron-injecting electrode 22, or in the case where electron-deficient substance 20 is uniformly distributed throughout the functional layer 23, it is preferable that the concentration of the electron-deficient substance 20 be in the range from 0.1 mol % to 50.0 mol %.

The functional layer 23 having the electron-deficient substance 20 distributed therein is formed in the following manner. First, a portion of a functional layer 23 that is not supposed to contain an electron-deficient substance 20 is formed, by deposition, on a hole-injecting electrode 12. Subsequently, an electron-deficient substance and a functional layer material are co-deposited as controlling the deposition rate so as to obtain a specified mixing ratio. Thereby, a functional layer 23 can be formed in which the electron-deficient substance 20 is uniformly distributed in the functional layer on the side of an electron-injecting electrode 22, within a given area. On the other hand, for formation of a functional layer 23 having an electron-deficient substance 20 distributed therein such that the concentration of the substance gradually increases toward an electron-injecting electrode 22, the layer can be formed by increasing the deposition temperature (specifically, by increasing the amount of electric current).

Figure 6:
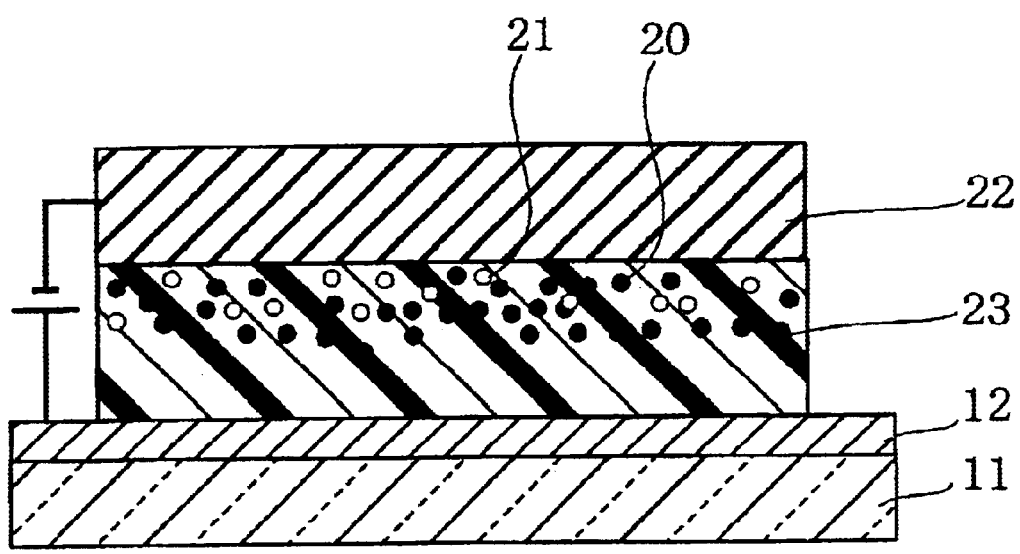
FIG. 6 is a schematic cross-sectional view showing another thin film EL device according to Embodiment 2 of the present invention.

It should be noted that the functional layer 23 may contain, as shown in FIG. 6, a low work function metal 21 as well as an electron-deficient substance 20. In this case, it is also possible to distribute the low work function metal 21 in the functional layer such that the concentration of the metal gradually increases toward an electron-injecting electrode 22. Here, the content of the low work function metal 21 can be set in the range from 0.01 weight % to 99.9 weight %. A content of less than 0.01 weight % reduces the electron-injection function, reducing electroluminescent efficiency, and thus is not desirable. On the other hand, when the content is greater than 99.9 weight %, the layer becomes extremely close to a single layer composed of a low work function metal, and as a result, the functional layer 23 cannot fully exert the light-emitting function.

Furthermore, the electron-injecting electrode 22 may be a multilayer electrode having a low work function metal layer containing a low work function metal and a passivating metal layer containing a metal with a higher work function than the low work function metal, stacked in this order from the side of a functional layer 23.

Embodiment 3

Still another embodiment of a thin film EL device according to the present invention is described below. It should be noted that the components having the same functions as those of the thin film EL device of Embodiment 1 are designated by the same reference numerals and thus will not be further described.

Thin film EL devices according to Embodiment 3 are different from thin film EL devices according to Embodiment 1 in that a capture layer containing a capturing substance is provided in place of the electron-deficient substance layer containing an electron-deficient substance. A more detailed description is as follows.

Figure 7:
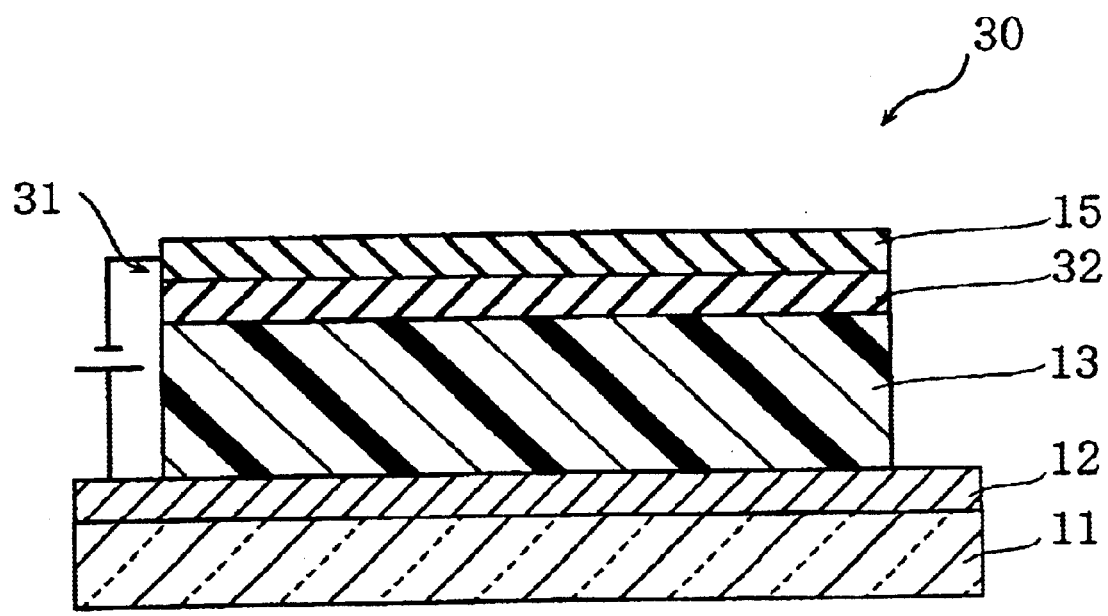
FIG. 7 is a schematic cross-sectional view showing a thin film EL device according to Embodiment 3 of the present invention.

FIG. 7 is a schematic cross-sectional view showing a thin film EL device according to Embodiment 3.

As shown in the figure, a thin film EL device 30 according to Embodiment 3 has at least a hole-injecting electrode 12, an electron-injecting electrode 31 paired with the hole-injecting electrode 12, and a functional layer 13 provided between the hole-injecting electrode 12 and the electron-injecting electrode 31, stacked on top of each other on a substrate 11.

The electron-injecting electrode 31 is formed from a metal layer 15 and a capture layer 32 containing a capturing substance and has a basic function of injecting electrons into the functional layer 13.

The capture layer 32 contains at least a capturing substance. The capturing substance is a substance that is capable of forming a coordinate bond in which an unshared pair of electrons of the capturing substance is donated to a cation of the low work function metal to share the unshared pair of electrons.

Examples of atoms which compose the capturing substance and to which unshared pairs of electrons belong include oxygen, sulfur, selenium, nitrogen, phosphorus, arsenic, and the like.

In addition, heterocyclic compounds that contain such atoms may be used. In this case, examples of heteroatoms in heterocycles include oxygen, sulfur, nitrogen, arsenic, and the like. The capturing substance may be compounds that contain functional groups such as carbonyl groups, amino groups, imino groups, and thiocarbonyl groups. Further, a chelating agent such as 1,10-phenanthroline may also be used which has two or more of such functional groups and allows the ion of the low work function metal to have a multidentate ligand.

In particular, electron-accepting capturing substances that accept electrons are most preferable, and an example of such electron-accepting capturing substances includes a compound represented by the following chemical formula (2).

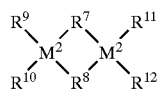

(2)

The $R^7$ and $R^8$ are each independently is a bridging ligand containing a nitrogen-containing aromatic ring or a derivative thereof which has at least one nitrogen atom as coordinating atom, halogen, or a bridging ligand containing alkyl of 1 to 3 carbons. In the bridging ligand containing a nitrogen-containing aromatic ring which has at least one nitrogen atom, examples of the bridging ligand containing a nitrogen-containing aromatic ring which has one nitrogen atom include pyrrole, pyridine, oxazole, 3,3'-bipyridine-5,5'-diyl, and the like. In addition, examples of the bridging ligand containing a nitrogen-containing aromatic ring which has two or more nitrogen atoms include imidazole, pyrazole, pyridazine, pyrazine, pyrimidine, phthalazine, 1H-indazole, oxadiazole, 9,10-phenanthroline, triazole, triazine, tetrazine, tetrazole, and the like. Further, examples of the halogen include F, Cl, Br, I, and At. Moreover, examples of the bridging ligand containing alkyl of 1 to 3 carbons include methyl, ethyl, and butyl.

The $R^9$, $R^{10}$, $R^{11}$, and $R^{12}$ are each independently is one selected from the group consisting of hydrogen, alkyl, an aryl derivative, and a heterocyclic derivative, and at least one of $R^9$ to $R^{12}$ is a ligand having an unshared pair of electrons. Examples of the alkyl include methyl, ethyl, and the like. In addition, examples of the aryl derivative include phenyl, tolyl, pyridyl, triazole, tetrazole, indazole, and the like. Further, examples of the heterocyclic derivative include pyrrole, pyridine, oxazole, 3,3'-bipyridine-5,5'-diyl, imidazole, pyrazole, pyridazine, pyrazine, pyrimidine, phthalazine, 1H-indazole, oxadiazole, 9,10-phenanthroline, triazole, triazine, tetrazine, tetrazole, and the like.

The $M^2$ is a metallic or semi-metallic element selected from a group of atoms consisting of Be, Mg, Ca, B, Al, and Ga.

A specific example of the compound represented by the chemical formula (2) includes 4,4,8,8-tetrakis(1H-pyrazole-1-yl)pyrazabole (hereinafter referred to as PPZB) represented by the following chemical formula (6).

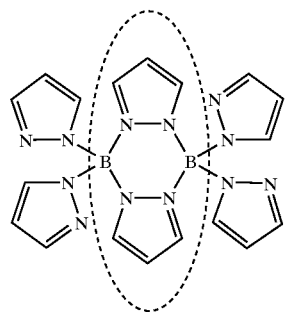

(6)

It should be noted that the portion circled with a broken line in the chemical formula (6) has a pyrazabole structure. This pyrazabole structure is a ring structure in which two bridging ligands (pyrazole) are respectively bonded to two borons by the bridging bond. Since the portion of the bridging bond has an insufficient number of electrons, PPZB is a kind of electron-deficient substances. Thus, PPZB has an electron-accepting property.

The technical significance of the provision of the capture layer 32, which contains a capturing substance such as that described above, in the electron-injecting electrode 14 is as follows.

Using an example in which PPZB is used as a capturing substance and Li as a low work function metal, the deterioration control mechanism of the low work function metal is described. As was discussed in Embodiment 1, Li which is contained in an electron-injecting electrode 14 emits electrons and becomes an Li cation (see the reaction formula (3)).

PPZB donates an unshared pair of electrons to the Li cation and forms another ring structure (chelate ring), as shown in the chemical formula (7) below, such that the Li (cation) is coordinated as being sandwiched. The chelate complex thus produced has a highly stable structure because of its steric effect.

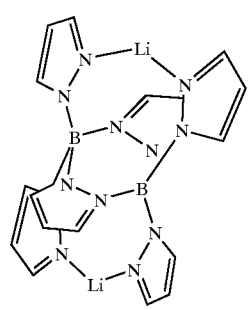

(7)

Accordingly, the provision of the capture layer 32 prevents the low work function metal such as Li from becoming an insulator such as an oxide or a nitride and allows electrons to be stably supplied to the functional layer 13. Consequently, while light emission with high luminance is realized, the lifetime of the device can be increased.

PPZB is also an electron-deficient substance and thus has an excellent electron transport property; as a result, it is also possible to inject more electrons into the luminescent layer.

The average film thickness of the capture layer 32 is preferably in the range of 0.1 to 100 nm. This is because when the capture layer 32 is in a monolayer structure having a substantially uniform film thickness, the film thickness, thought it varies with the type of the capturing substance, results in on the order of 0.1 nm or more, making it difficult to form the capture layer 32 having a film thickness smaller than that. On the other hand, a film thickness of greater than 100 nm increases the applied voltage, bringing about device degradation, and thus is not desirable.

Now, a fabrication method of a thin film EL device according to Embodiment 2 is described.

First, in the same manner as described in Embodiment 1, a hole-injecting electrode 12 is formed on a substrate 11, and then on the electron-injecting electrode 14 a functional layer 13 is formed.

Next, on the functional layer 13, a capture layer 32 is formed by vacuum vapor deposition. Deposition conditions are not particularly limited and thus are appropriately set so that a desired film structure is formed. Specifically, when depositing under conditions, for example, where the deposition rate is 0.01 to 0.5 nm/sec and the vacuum pressure is $10^3$ to $10^6$ Pa, the capture layer 32 with a good film structure can be formed.

Subsequently, on the capture layer 32, a metal layer 15 is formed, for example, by deposition or sputtering. At this point, the low work function metal is changed into an oxide, a nitride, or the like during the formation process of the metal layer 15, that is, the deterioration of the metal is already underway at the beginning of the device fabrication process. Due to this, conventional devices had lower light-emission luminance than the theoretically predicted value.

However, in the present embodiment, since the metal layer 15 is formed on the capture layer 32, the deterioration of the low work function metal can be prevented. A more detailed description is as follows. The low work function metal emits electrons and becomes a cation even during the film formation process. The metal cation, before becoming an oxide or a nitride by reacting with water, oxygen, and the like, is captured by the capturing substance. Thereby, the metal layer 15 can be formed as preventing deterioration of the low work function metal, allowing light emission with high luminance.

Furthermore, the prevention of the deterioration of the low work function metal allows the film thickness of the metal layer 15 to be made even thinner, thereby achieving good workability. In addition, variations in light-emission luminance in the plane can be controlled, and thus it is possible to fabricate a device with good reproducibility and to improve yield.

As described above, with the fabrication method of a thin film EL device according to Embodiment 2, a thin film EL device with extremely high light-emission luminance compared with a conventional thin film EL device can be fabricated with good workability and good reproducibility.

Figure 8:
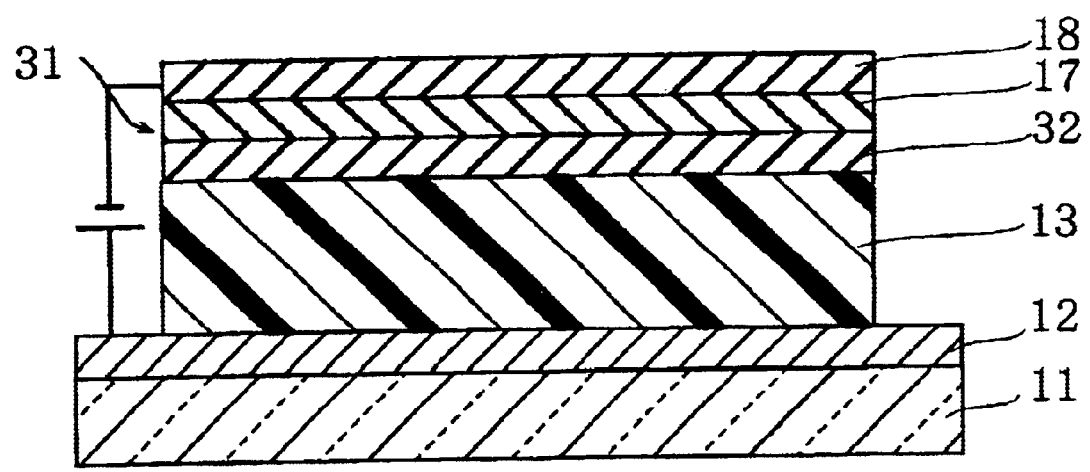
FIG. 8 is a schematic cross-sectional view showing another thin film EL device according to Embodiment 3 of the present invention.

It should be noted that in the present embodiment the electron-injecting electrode 31 was described, as an example, for the case where the electrode is formed from the metal layer 15 containing an alloy and the capture layer 32, but the present invention is not limited thereto. For example, as shown in FIG. 8, an electron-injecting electrode 14 may be a multilayer electrode having a capture layer 32, a low work function metal layer 17, and a passivating metal layer 18, stacked in this order from the side of a functional layer 13.

Figure 9:
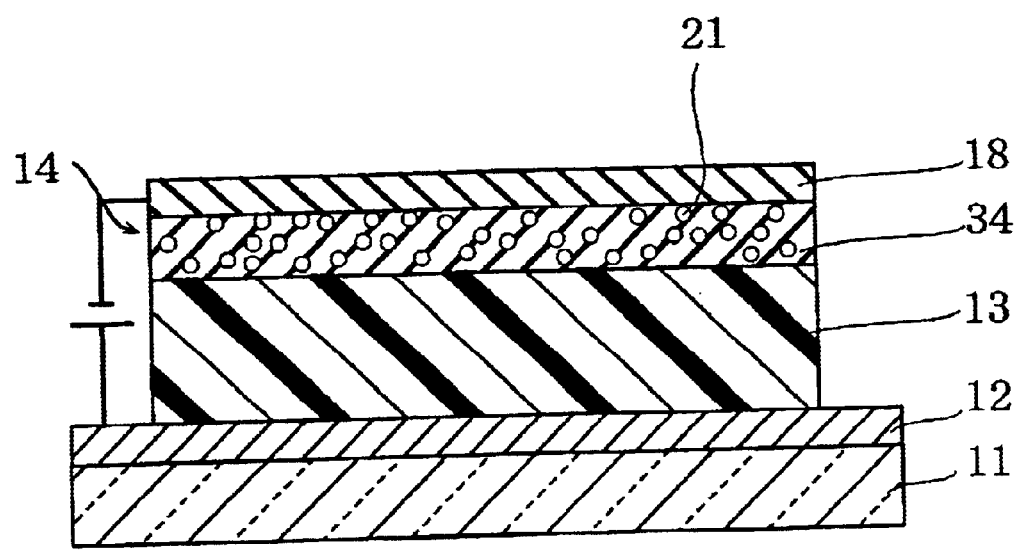
FIG. 9 is a schematic cross-sectional view showing still another thin film EL device according to Embodiment 3 of the present invention.

Furthermore, as shown in FIG. 9, an electron-injecting electrode 31 may be a multilayer electrode having a capture layer 32 containing a low work function metal 21 and a passivating metal layer 18, stacked in this order from the side of a functional layer 13. In this case, the film thickness of the capture layer 32 is preferably in the range of 0.1 to 1000 nm. This is because when the capture layer 32 is in a monolayer structure having a substantially uniform film thickness, the film thickness, though it varies with the type of the capturing substance, results in on the order of 0.1 nm or more, making it difficult to form the capture layer 32 having a film thickness smaller than that. On the other hand, a film thickness of greater than 1000 nm increases the applied voltage, bringing about device degradation, and thus is not desirable. Further, the concentration of the capturing substance should be in the range of 30 to 99 mol %. A concentration of 30 mol % or less is not desirable because with such a concentration the electron transport property cannot be sufficiently improved and the deterioration of the low work function metal cannot be prevented. On the other hand, a concentration of 99 mol % or more relatively reduces the ratio of the low work function metal, reducing the amount of electrons to be injected, and thus is not desirable. The capture layer 34 can be formed by co-depositing a capturing substance and a low work function metal. The passivating metal layer 18 can be formed by deposition, sputtering, or the like, as the above-described case.

Figure 10:
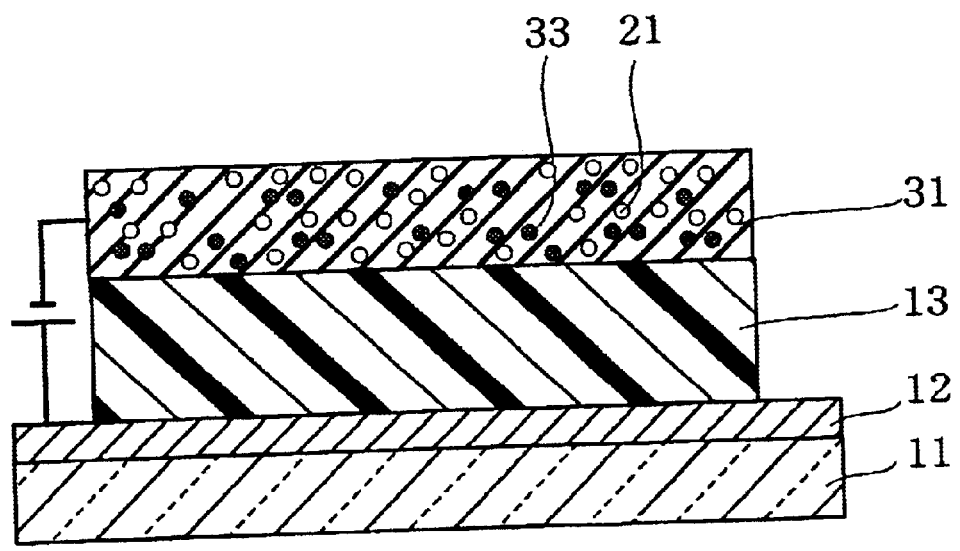
FIG. 10 is a schematic cross-sectional view showing yet another thin film EL device according to Embodiment 3 of the present invention.

Moreover, as shown in FIG. 10, an electron-injecting electrode 31 may be a single layer containing a capturing substance 33, a low work function metal 21, and a metal with a higher work function than the low work function metal 21. In this case, as the film-forming technique for the electron-injecting electrode 31, co-deposition can be employed.

It should be noted that in the present embodiment the capture layer 32 was described, as an example, for the case of a multilayer structure, but the present invention is not limited thereto. For example, a capture layer may be provided in an island configuration between the capture layer 32 and the metal layer 15 or between the capture layer 32 and the low work function metal layer 17. Even with such configurations, it is possible to inhibit deterioration of the low work function metal and to improve the light-emission lifetime of the device.

Embodiment 4

Yet another embodiment of a thin film EL device according to the present invention is described below. It should be noted that the components having the same functions as those of the thin film EL device of Embodiment 3 are designated by the same reference numerals and thus will not be further described.

Thin film EL devices according to Embodiment 4 are different from thin film EL devices according to Embodiment 3 in that a capturing substance is contained in the functional layer but not in the electron-injecting electrode.

Figure 11A:
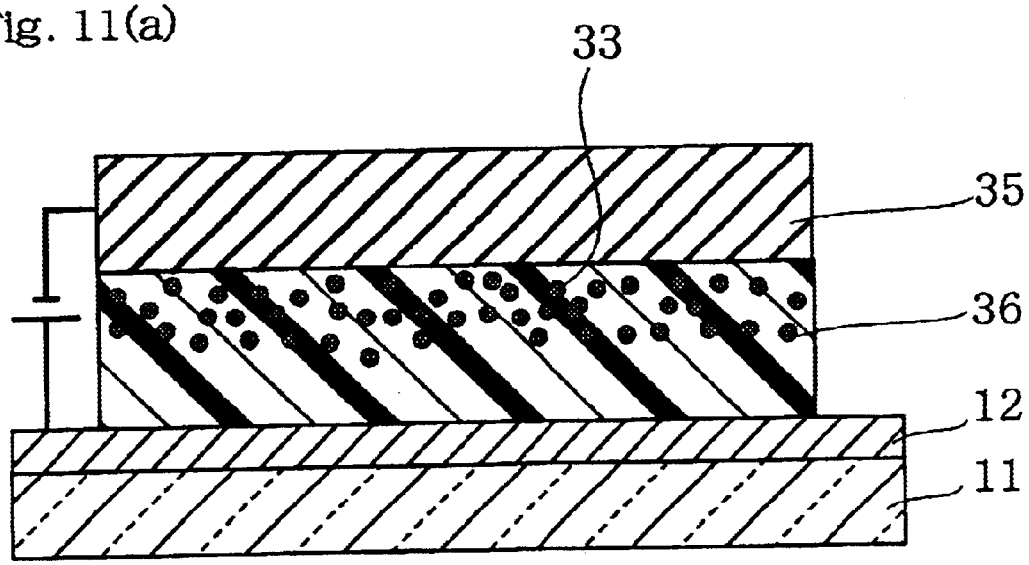
FIGS. 11(a) and 11(b) are schematic cross-sectional views each showing a thin film EL device according to Embodiment 4 of the present invention.

FIG. 11(a) is a schematic cross-sectional view showing a thin film EL device according to Embodiment 4 and shows a state in which a capturing substance is uniformly distributed in a functional layer. An electron-injecting electrode 35 shown in the figure is a metal layer containing an alloy composed of at least two or more different metals having different work functions. A functional layer 36 basically has the same function as the functional layer according to Embodiment 1, but in the present embodiment, the functional layer further contains a capturing substance 33. The capturing substance 33 is provided so as to be distributed in the functional layer 36 on the side of the electron-injecting electrode 35. The area where the capturing substance 33 is present should be in the range of about two-thirds of the functional layer 36 from the boundary between the functional layer 36 and the electron-injecting electrode 35. Here, the film thickness of the functional layer 36 is, for example, 50 to 1000 nm.

It should be noted that the capturing substance 33 may be uniformly distributed throughout the functional layer 36.

Figure 11B:
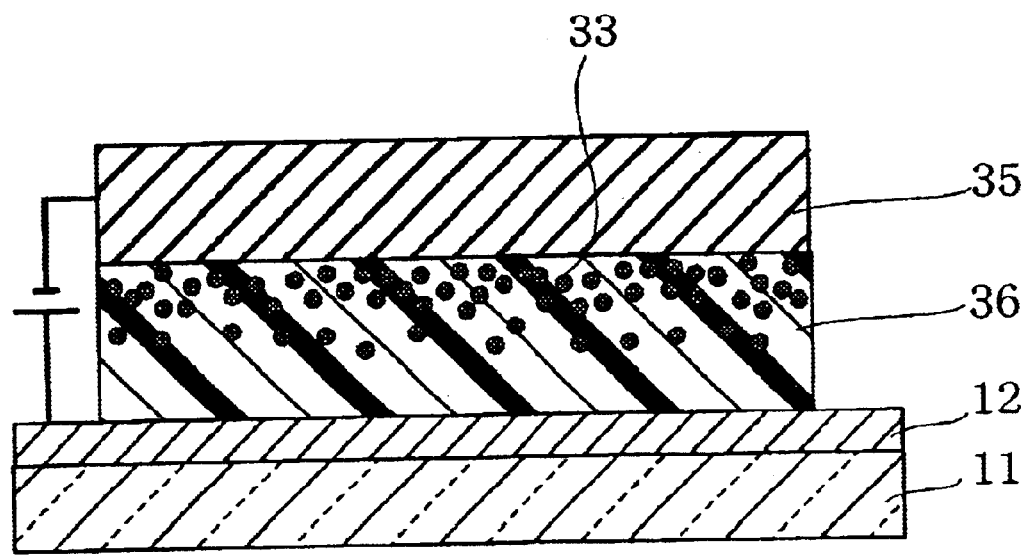

Furthermore, the capturing substance 33 can be distributed in the functional layer, as shown in FIG. 11(b), such that the concentration of the substance gradually increases toward an electron-injecting electrode 35. The reaction between the capturing substance and the cations of the low work function metal occurs more frequently at the boundary between the functional layer 36 and the electron-injecting electrode 35. Though part of the cations enter into the functional layer 36 by ablation, because the number of the cations gradually decreases toward the center of the functional layer 36, the frequency of the reaction between the capturing substance and the cations decreases accordingly. Thus, when a concentration gradient is established, as in the above-described configuration, electrons can be efficiently donated to the cations of the low work function metal.

The concentration of the capturing substance 33 is preferably in the range from 0.1 mol % to 99.9 mol %. When the concentration is less than 0.1 mol %, the cations of the low work function metal cannot be captured sufficiently due to coordinate bonds or the like. On the other hand, when the concentration is greater than 99.9 mol %, the layer becomes extremely close to a single layer composed of the capturing substance, and as a result, the functional layer 36 cannot fully exert the light-emitting function. Further, when the capturing substance 33 is uniformly distributed in the functional layer within a given area from the boundary between the functional layer 36 and the electron-injecting electrode 35, or when the capturing substance 33 is uniformly distributed throughout the functional layer 36, the concentration of the capturing substance 33 is preferably in the range from 0.1 mol % to 50.0 mol %.

Figure 12:
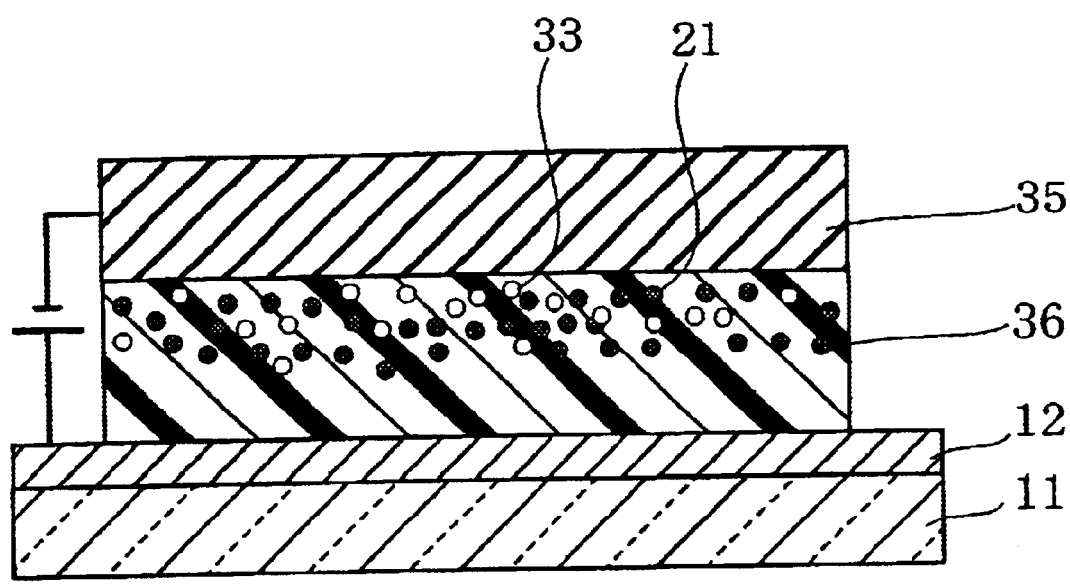
FIG. 12 is a schematic cross-sectional view showing another thin film EL device according to Embodiment 4 of the present invention.

It should be noted that the functional layer 36 can also contain a low work function metal 21 as well as a capturing substance 33, as shown in FIG. 12. In this case, it is also possible to distribute the low work function metal 21 in the functional layer such that the concentration of the metal gradually increases toward an electron-injecting electrode 35. Here, the content of the low work function metal 21 should be in the range from 0.01 weight % to 99.9 weight %. A content of less than 0.01 weight % reduces the electron-injection function, reducing electroluminescent efficiency, and thus is not desirable. On the other hand, when the content is greater than 99.9 weight %, the layer becomes extremely close to a single layer composed of the low work function metal, and as a result, the functional layer 36 cannot fully exert the light-emitting function.

Furthermore, the electron-injecting electrode 35 may be a multilayer electrode having a low work function metal layer and a passivating metal layer, stacked in this order from the side of the functional layer 36.

The functional layer 36 having the capturing substance 33 distributed therein can be formed in the same manner as that described in Embodiment 2. Specifically, a portion of a functional layer 36 that is not supposed to contain a capturing substance 33 is formed, in advance, on a hole-injecting electrode 12 by deposition. Subsequently, a capturing substance and a functional layer material are co-deposited as controlling the deposition rate so as to obtain a specified mixing ratio. Thereby, a functional layer 36 can be formed in which the capturing substance 33 is uniformly distributed on the side of an electron-injecting electrode 35, within a given area. On the other hand, for formation of a functional layer 36 having a capturing substance 33 distributed therein such that the concentration of the substance gradually increases toward the electron-injecting electrode 35, the layer can be formed by increasing the deposition temperature (specifically, by increasing the amount of electric current).

Embodiment 5

Another embodiment of a thin film EL device according to the present invention is described below. It should be noted that the components having the same functions as those of the thin film EL devices of the foregoing embodiments are designated by the same reference numerals and thus will not be further described.

Thin film EL devices according to Embodiment 5 are different from thin film EL devices according to each of the foregoing embodiments in that both an electron-deficient substance and a capturing substance are utilized. A more detailed description is as follows.

Figure 13:
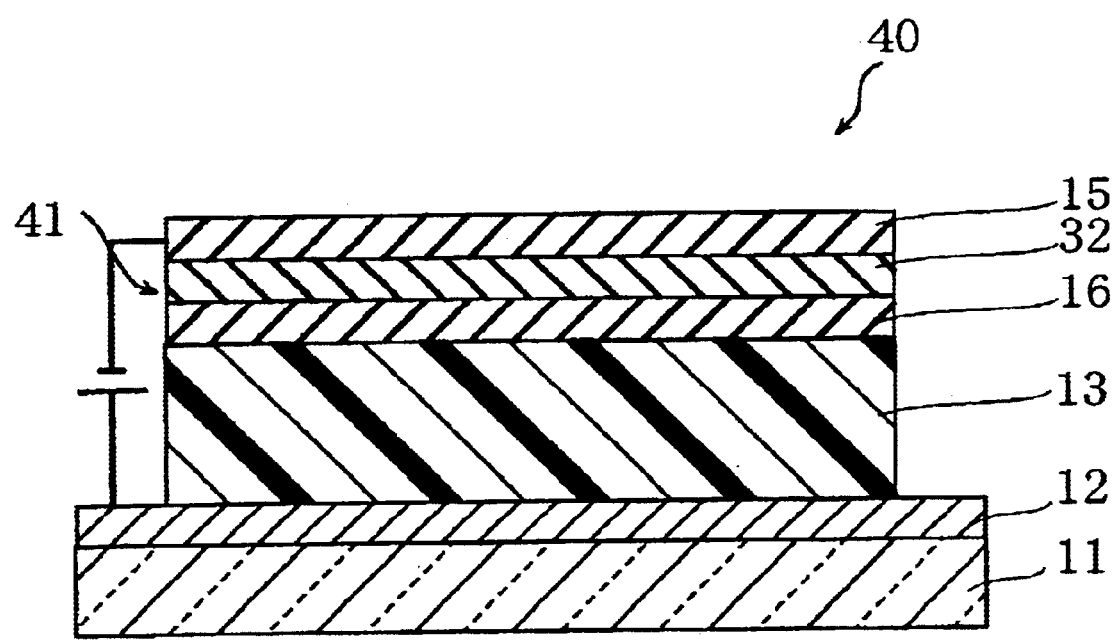
FIG. 13 is a schematic cross-sectional view showing a thin film EL device according to Embodiment 5 of the present invention.

FIG. 13 is a schematic cross-sectional view showing a thin film EL device according to Embodiment 5.

As shown in the figure, a thin film EL device 40 according to the present embodiment has at least a hole-injecting electrode 12, an electron-injecting electrode 41 paired with the hole-injecting electrode 12, and a functional layer 13 provided between the hole-injecting electrode 12 and the electron-injecting electrode 41, stacked on top of each other on a substrate 11.

The electron-injecting electrode 41 is a multilayer electrode having an electron-deficient substance layer 16, a capture layer 32, and a metal layer 15, stacked in this order from the side of the functional layer 13. The electron-deficient substance layer 16 has an excellent electron transport property, and thus more electrons can be injected into the functional layer 13, whereby the recombination rate of holes and electrons is increased, improving electroluminescent efficiency. In the meantime, the capture layer 32 captures a low work function metal before the metal changes into an oxide or the like, thereby preventing deterioration of the low work function metal. The provision of both the electron-deficient substance layer 16 and the capture layer 32 within one and the same device thus improves the light-emission lifetime and allows for light-emission with high luminance.

Furthermore, the electron-injecting electrode 41 may be a multilayer electrode having, in place of the metal layer 15, a low work function metal layer 22 and a passivating metal layer 18, stacked in this order from the side of the capture layer 32.

Figure 14:
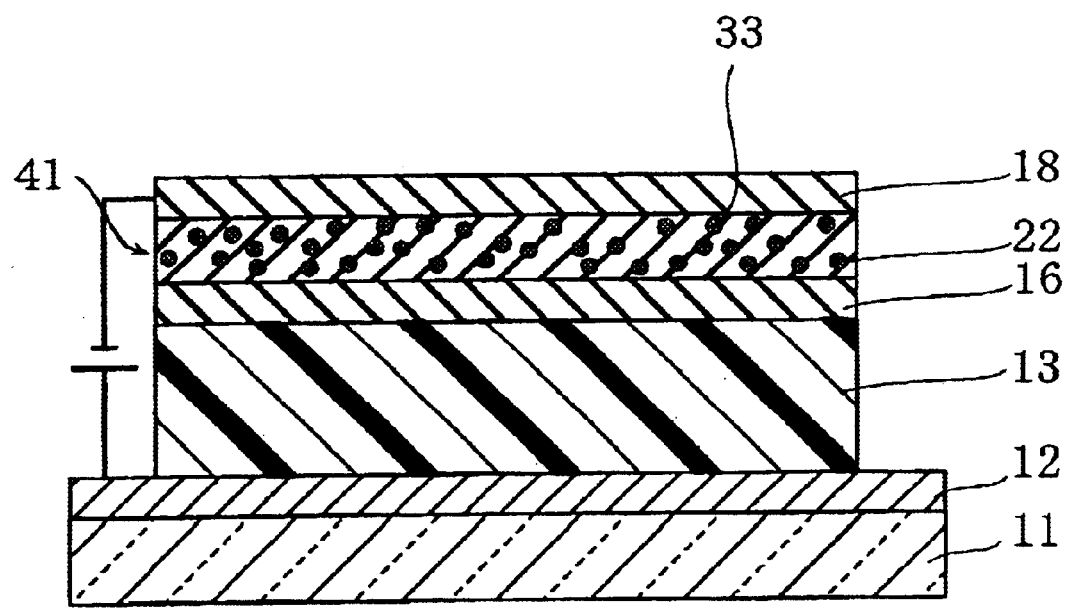
FIG. 14 is a schematic cross-sectional view showing another thin film EL device according to Embodiment 5 of the present invention.

Moreover, an electron-injecting electrode 41 may be a multilayer electrode, as shown in FIG. 14, having an electron-deficient substance layer 16, a low work function metal layer 22 containing a capturing substance 33, and a passivating metal layer 18, stacked in this order from the side of a functional layer 13.

The electron-injecting electrode 41 may also be such that an electron-deficient substance and a capturing substance are contained in the same layer, and on this layer the metal layer 15 is stacked or the low work function metal layer and the passivating metal layer are stacked on top of each other.

Since the electron-deficient substance has an excellent electron transport property and the capturing substance is effective in capturing a low work function metal, it is advantageous that the capture layer 32 be provided on the side of the metal layer 15 containing a low work function metal or on the side of the low work function metal layer 22. It should be noted, however, that there is possibility that the diffusion of the cations of the low work function metal into the functional layer 13 may deactivate the excited state of the luminescent material in the functional layer 13. Thus, in order to prevent the deactivation, the electron-injecting electrode 41 may be formed such that the capture layer 32/electron-deficient substance layer 16/metal layer 15 are stacked in this order from the side of the functional layer 13. Alternatively, the electron-injecting electrode 41 may be formed such that the capture layer 32/electron-deficient substance layer 16/low work function metal layer 22/passivating metal layer 18 are stacked in this order from the side of the functional layer 13.

Embodiment 6

Still another embodiment of a thin film EL device according to the present invention is described below. It should be noted that the components having the same functions as those of the thin film EL device of Embodiment 3 are designated by the same reference numerals and thus will not be further described.

Thin film EL devices according to Embodiment 6 are different from thin film EL devices according to Embodiment 3 in that an electron-deficient substance and/or a capturing substance is(are) contained in the functional layer but not in the electron-injecting electrode.

Figure 15A:
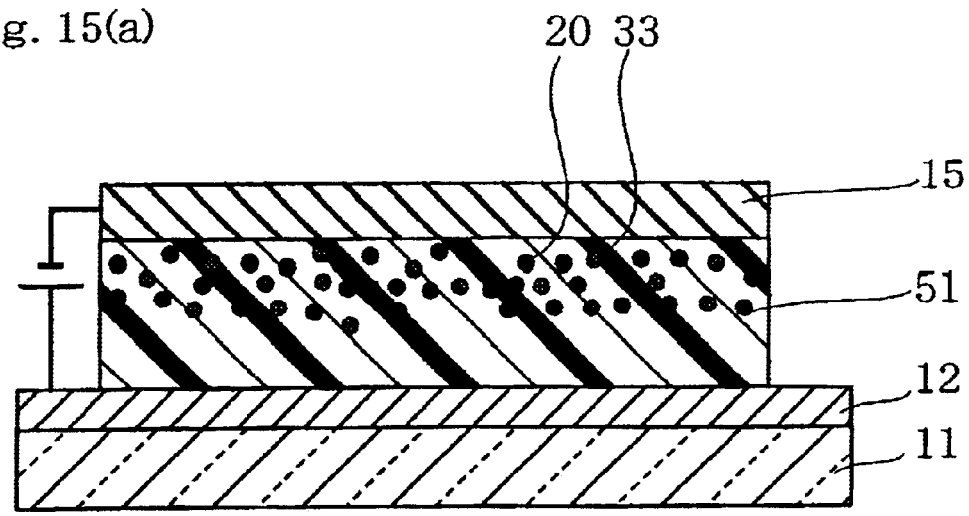
FIGS. 15(a) and 15(b) are schematic cross-sectional views each showing a thin film EL device according to Embodiment 6 of the present invention.

More specifically, for example, as shown in FIG. 15(a), it is possible to employ a configuration in which an electron-injecting electrode formed from a metal layer 15 is stacked on a functional layer 51 having therein an electron-deficient substance 20 and a capturing substance 33 distributed on the side of the electron-injecting electrode 31.

Figure 15B:
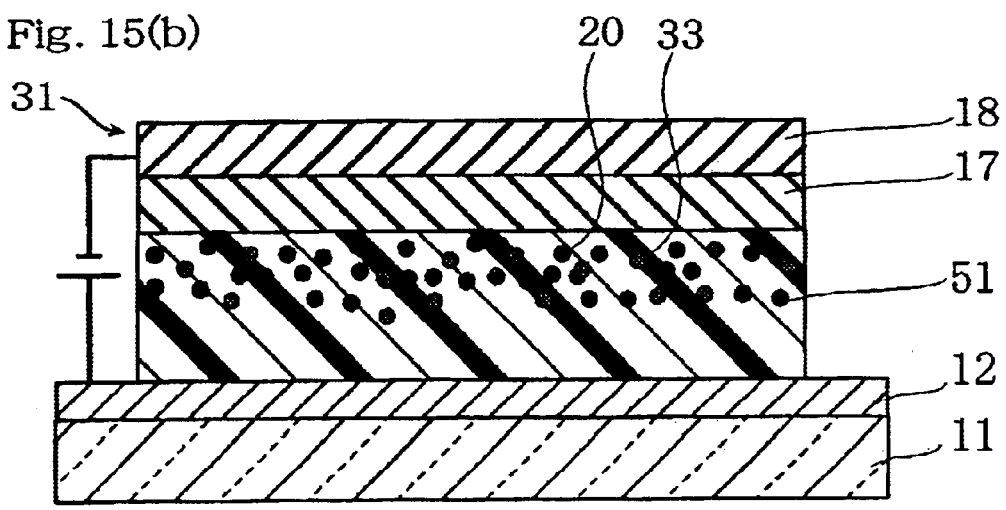
Figure 16:
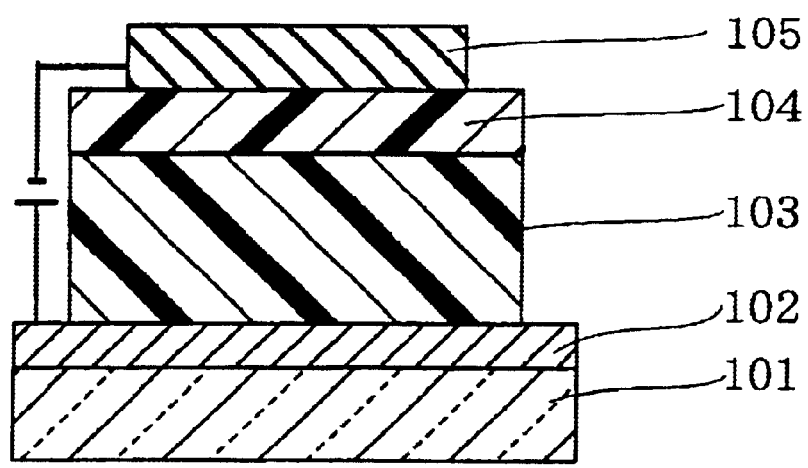
FIG. 16 is a schematic cross-sectional view showing another thin film EL device according to Embodiment 6 of the present invention.
Figure 17:
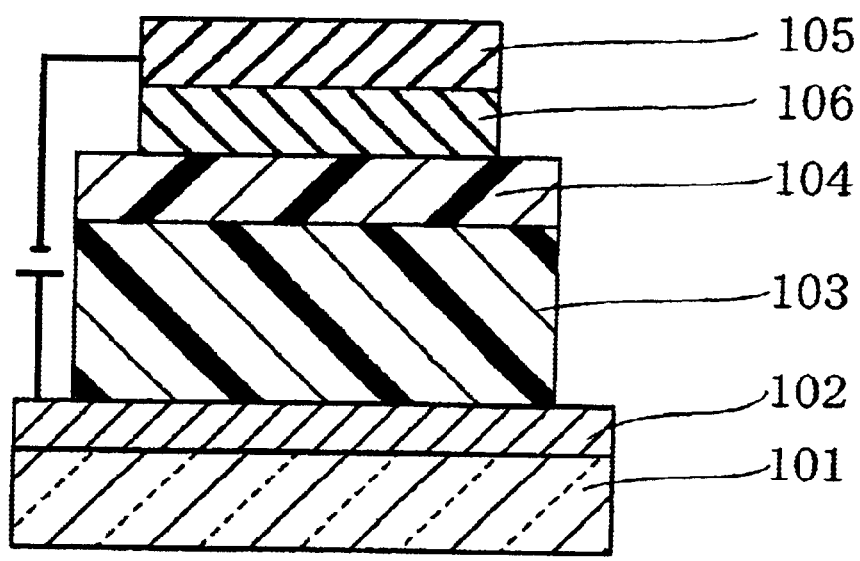
FIG. 17 is a schematic cross-sectional view showing a prior art thin film EL device.

Furthermore, as shown in FIG. 15(b), in place of the metal layer 15, a low work function metal layer 17 and a passivating metal layer 18 can be stacked in this order from the side of a functional layer 51.

Moreover, it is also possible to employ a configuration in which one of the electron-deficient substance 20 and the capturing substance 33 is contained in the functional layer and the other is contained in the electron-injecting electrode.

(Miscellaneous)

It should be noted that each of the foregoing embodiments described the configuration in which the hole-injecting electrode, the functional layer, and the electron-injecting electrode are sequentially provided on the substrate, but the present invention is not limited thereto. For example, a device may be such that the electron-injecting electrode, the functional layer, and the hole-injecting electrode are sequentially stacked on the substrate.

Furthermore, each of the foregoing embodiments described, as an example, a thin film EL device that provides planar light emission from the substrate side, but light can also be extracted from the electron-injecting electrode side. In the present invention, as described in, for example, Embodiments 1, 3, and 5, the electron-deficient substance layer and/or the capture layer, for example, is(are) provided on the functional layer, and therefore damage to the functional layer can be minimized during the formation of the low work function metal layer and the like. Minimization of damage to the functional layer allows for the formation of a transparent or translucent conductive film, instead of a passivating metal layer composed of Al or the like. Examples of the transparent or translucent conductive film include alloy thin films and the like composed of ITO, Au, an Mg—Ag alloy, an Ag—Pd—Cu alloy, or the like. Consequently, the following additional effects were achieved. Namely, when light is obtained through a transparent substrate such as a glass substrate, all the light emitted from the functional layer does not pass through the substrate; part of the light is lost by total reflection within the substrate. However, with the above-described configuration, light can be extracted without allowing it to pass through the substrate, and therefore the loss of light can be minimized and the light extraction efficiency can be significantly improved. In this case, the visible light transmittance of the electron-injecting electrode is preferably 50% or more, and more preferably 70% or more.

It should be noted that each of the foregoing embodiments described, as an example, a direct-current drive thin film EL device, but the present invention is not limited thereto. For example, it is also possible to employ an alternating current drive type or a pulse drive type.

Furthermore, an electrode having an electron-deficient substance and/or a capturing substance according to the present invention can be applied to bio sensors and photoelectric converters (for example, solar batteries and optical sensors) in addition to thin film EL devices.

Now, the present invention is described in more detail with reference to the examples and comparative examples but is not limited thereto. It should be noted that the following Examples 1 to 3 relate to thin film EL devices utilizing electron-deficient substances, the following Examples 4 to 7 to thin film EL devices utilizing capturing substances, and Examples 8 to 10 to thin film EL devices utilizing electron-deficient substances and capturing substances.

EXAMPLE 1

First, an ITO (Indium Tin Oxide) film (hole-injecting electrode) was formed on a glass substrate by sputtering. Next, using N,N'-diphenyl-N,N'-bis(3-methylphenyl)-1,1'-biphenyl-4,4'-diamine as a hole-transport layer material, a hole-transport layer was formed on the ITO film by deposition. The film thickness of the hole-transport layer was 50 nm.

Subsequently, using tris(8-quinolinolato)aluminum as an organic luminescent layer material, an organic luminescent layer (luminescent layer) was formed on the hole-transport layer by deposition. The film thickness of the organic luminescent layer was 50 nm. In addition, using 4,4,8,8-tetraphenylpyrazabole as an electron-deficient substance, an electron-deficient substance layer was formed on the organic luminescent layer by deposition. The film thickness of the electron-deficient substance layer was 1 nm.

Then, an Li film (low work function metal layer) of 0.5 nm thickness was formed on the electron-deficient substance layer by deposition. Further, on the Li film, an Al film (passivating metal layer) of 100 nm thickness was formed. Thereby, a thin film EL device of the present invention was fabricated.

The electroluminescent characteristics were measured by connecting the power supply to the ITO film and Al film of the thin film EL device and applying a direct-current voltage thereto. As a result, with an applied voltage of about 4 V, a luminance (luminescence level) of about 500 cd/m$^2$ and an electroluminescent efficiency of 5.0 cd/A were obtained.

Furthermore, a continuous light-emission test at constant current was conducted on the thin film EL device according to the present example. As a result, the lifetime to half luminance was about 700 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 2

A thin film EL device according to Example 2 is different from a thin film EL device according to Example 1 in that instead of providing the electron-deficient substance layer, a luminescent layer containing an electron-deficient substance is provided.

An organic luminescent layer according to Example 2 was formed in the following manner. Specifically, using tris(8-quinolinolato)aluminum as an organic luminescent layer material, a single layer composed of an organic luminescent material (film thickness of 40 nm) was formed on a hole-transport layer by deposition. Subsequently, tris(8-quinolinolato) aluminum and 4,4,8,8-tetraphenylpyrazabole as an electron-deficient substance were co-deposited, thus forming a layer (film thickness of 10 nm) in which the electron-deficient substance was uniformly distributed in the organic luminescent material. Thereby, an organic luminescent layer (luminescent layer, film thickness of 50 nm) was formed. It should be noted that the weight ratio of the organic luminescent layer material to the electron-deficient substance material was made to be 9:1.

The thin film EL device according to Example 2 was examined for its electroluminescent characteristics in the same manner as that of Example 1. With an applied voltage of about 4 V, a luminance (luminescence level) of about 500 cd/m² and an electroluminescent efficiency of 5.0 cd/A were obtained.

Furthermore, a continuous light-emission test at constant current was conducted on the thin film EL device according to the present example. As a result, the lifetime to half luminance was about 700 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 3

A thin film EL device according to Example 3 is different from a thin film EL device according to Example 1 in that an electron-deficient substance is contained in the Li layer.

An electron-deficient substance layer according to Example 3 was formed, by co-deposition, on an organic luminescent layer such that the mol ratio of Li to an electron-deficient substance is 1:1.

The thin film EL device according to Example 2 was examined for its electroluminescent characteristics in the same manner as that of Example 1. With an applied voltage of about 4 V, a luminance (luminescence level) of about 500 cd/m² and an electroluminescent efficiency of 5.0 cd/A were obtained.

Furthermore, a continuous light-emission test at constant current was conducted on the thin film EL device according to the present example. As a result, the lifetime to half luminance was about 700 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 4

A thin film EL device according to Example 4 is different from a thin film EL device according to Example 1 in that a capture layer is provided in place of the electron-deficient substance layer.

A capture layer according to Example 4 was formed, by deposition, on the organic luminescent layer, using, as a capturing substance, 4,4,8,8-tetrakis(1H-pyrazole-1-yl) pyrazabole having an electron-accepting property. The film thickness of the capture layer was 1 nm.

The thin film EL device according to Example 4 was examined for its electroluminescent characteristics in the same manner as that of Example 1. With an applied voltage of about 4 V, a luminance (luminescence level) of about 500 cd/m² and an electroluminescent efficiency of 6.0 cd/A were obtained.

Furthermore, a continuous light-emission test at constant current was conducted on the thin film EL device according to the present example. As a result, the lifetime to half luminance was about 700 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 5

A thin film EL device according to Example 5 is different from a thin film EL device according to Example 4 in that the film thickness of a capture layer is 2 nm but not 1 nm.

The thin film EL device according to Example 4 was examined for its electroluminescent characteristics in the same manner as that of Example 1. With an applied voltage of about 4 V, a luminance (luminescence level) of about 600 cd/m² and an electroluminescent efficiency of 6.0 cd/A were obtained.

Furthermore, a continuous light-emission test at constant current was conducted on the thin film EL device according to the present example. As a result, the lifetime to half luminance was about 1000 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 6

A thin film EL device according to Example 6 is different from a thin film EL device according to Example 5 in that instead of providing the capture layer, an organic luminescent layer containing a capturing substance is provided.

An organic luminescent layer according to Example 6 was formed in the following manner. Specifically, using tris(8-quinolinolato)aluminum as an organic luminescent layer material, a single layer composed of an organic luminescent material (film thickness of 40 nm) was formed on a hole-transport layer by deposition. Subsequently, tris(8-quinolinolato) aluminum and 4,4,8,8-tetrakis(1H-pyrazole-1-yl)pyrazabole as a capturing substance were co-deposited, thus forming a layer (film thickness of 10 nm) in which the capturing substance was uniformly distributed in the organic luminescent material. Thereby, an organic luminescent layer Luminescent layer, film thickness of 50 nm) was formed. It should be noted that the weight ratio of the organic luminescent layer material to the capturing substance material was made to be 8:2.

The thin film EL device according to Example 6 was examined for its electroluminescent characteristics in the same manner as that of Example 1. With an applied voltage of about 4 V, a luminance (luminescence level) of about 600 cd/m² and an electroluminescent efficiency of 6.0 cd/A were obtained.

Furthermore, a continuous light-emission test at constant current was conducted on the thin film EL device according to the present example. As a result, the lifetime to half luminance was about 1000 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 7

A thin film EL device according to Example 7 is different from a thin film EL device according to Example 5 in that a capturing substance is contained in the Li layer.

An electron-deficient substance layer according to Example 3 was formed, by co-deposition, on an organic luminescent layer such that the mol ratio of Li to a capturing substance is 1:2.

The thin film EL device according to Example 2 was examined for its electroluminescent characteristics in the same manner as that of Example 1. With an applied voltage of about 4 V, a luminance (luminescence level) of about 600 cd/m² and an electroluminescent efficiency of 6.0 cd/A were obtained.

Furthermore, a continuous light-emission test at constant current was conducted on the thin film EL device according to the present example. As a result, the lifetime to half luminance was about 1000 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 8

A thin film EL device according to Example 8 is different from a thin film EL device according to Example 1 in that a capture layer is provided on the electron-deficient substance layer. More specifically, an electron-deficient substance layer of 10 nm film thickness and a capture layer of 5 nm film thickness are sequentially provided on an organic luminescent layer of 30 nm film thickness. In addition, in Example 8, as the anode, an ITO film of 100 nm film thickness was formed in place of the Al film.

The thin film EL device according to Example 8 was examined for its electroluminescent characteristics in the same manner as that of Example 1. With an applied voltage of about 5 V, a luminance (luminescence level) of about 500 cd/m² and an electroluminescent efficiency of 5.5 cd/A were obtained.

Furthermore, a continuous light-emission test at constant current was conducted on the thin film EL device according to the present example. As a result, the lifetime to half luminance was about 1800 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 9

A thin film EL device according to Example 9 is different from a thin film EL device according to Example 8 in that an organic luminescent layer (film thickness of 20 nm) containing an electron-deficient substance is provided in place of the electron-deficient substance layer.

An organic luminescent layer according to Example 9 was formed in the following manner. Specifically, using tris(8-quinolinolato)aluminum as an organic luminescent layer material, a single layer (film thickness of 20 nm) composed of an organic luminescent material was formed on a hole-transport layer by deposition. Subsequently, tris(8-quinolinolato) aluminum and 4,4,8,8-tetraphenylpyrazabole as an electron-deficient substance were co-deposited, thus forming a layer (film thickness of 20 nm) in which the electron-deficient substance was uniformly distributed in the organic luminescent material. Thereby, an organic luminescent layer (luminescent layer, film thickness of 40 nm) was formed. It should be noted that the weight ratio of the organic luminescent layer material to the electron-deficient substance material was made to be 1:1.

The thin film EL device according to Example 9 was examined for its electroluminescent characteristics in the same manner as that of Example 1. With an applied voltage of about 5 V, a luminance (luminescence level) of about 500 cd/m² and an electroluminescent efficiency of 5.5 cd/A were obtained.

Furthermore, a continuous light-emission test at constant current was conducted on the thin film EL device according to the present example. As a result, the lifetime to half luminance was about 1800 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

EXAMPLE 10

A thin film EL device according to Example 10 is different from a thin film EL device according to Example 8 in that a capturing substance is contained in the Li layer.

A capture layer according to Example 10 was formed, by co-deposition, on an electron-deficient substance layer such that the mol ratio of a capturing substance material to Li is 1:2.

The thin film EL device according to Example 10 was examined for its electroluminescent characteristics in the same manner as that of Example 1. With an applied voltage of about 5 V, a luminance (luminescence level) of about 500 cd/m² and an electroluminescent efficiency of 5.5 cd/A were obtained.

Furthermore, a continuous light-emission test at constant current was conducted on the thin film EL device according to the present example. As a result, the lifetime to half luminance was about 1800 hours at an initial luminance of 300 cd/m². These results are shown in Table 1 below.

Moreover, a display device was fabricated in which the above-described thin film EL devices were arranged in a 100×100 matrix. The display device was allowed to display moving images, and it was confirmed that good quality images can be obtained with this device.

Comparative Example 1

A thin film EL device for comparison according to Comparative Example 1 is different from a thin film EL device according to Example 1 in that the device does not have the electron-deficient substance layer.

The thin film EL device for comparison was measured for its electroluminescent characteristics in the same manner as that of Example 1. With an applied voltage of about 5 V, a luminance of about 300 cd/m² and an electroluminescent efficiency of 3.5 cd/A were obtained.

Furthermore, a continuous light-emission test at constant current was conducted. The lifetime to half luminance was about 100 hours at an initial luminance of 300 cd/m². These results are shown in Table 1 below.

Comparative Example 2

A thin film EL device for comparison according to Comparative Example 1 is different from a thin film EL device according to Example 1 in that the device does not have the Li film.

The thin film EL device for comparison was measured for its electroluminescent characteristics in the same manner as that of Example 1. With an applied voltage of about 4 V, a luminance of about 500 cd/m² and an electroluminescent efficiency of 4.5 cd/A were obtained.

Furthermore, a continuous light-emission test at constant current was conducted. The lifetime to half luminance was about 550 hours at an initial luminance of 300 cd/m². These results are shown in Table 1 below.

(Results)

As is clear from Table 1 below, it was found that thin film EL devices according to the present invention which included electron-deficient substances and/or capturing substances had higher electroluminescent efficiencies and excellent electroluminescent characteristics as compared with thin film EL devices for comparison. In addition, the lifetimes to half luminance for initial luminance are long, as a result of which it was confirmed that a decrease in lifetime was inhibited.

TABLE 1

|  | Applied voltage (V) | Luminance (cd/m²) | Electroluminescent efficiency (cd/A) | Initial luminance (cd/m²) | Lifetime to half luminance (hr) |
| --- | --- | --- | --- | --- | --- |
| Example 1 | 4 | 500 | 5.0 | 300 | 700 |
| Example 2 | 4 | 500 | 5.0 | 300 | 700 |
| Example 3 | 4 | 500 | 5.0 | 300 | 700 |
| Example 4 | 4 | 500 | 6.0 | 300 | 700 |
| Example 5 | 4 | 600 | 6.0 | 300 | 1000 |
| Example 6 | 4 | 600 | 6.0 | 300 | 1000 |
| Example 7 | 4 | 600 | 6.0 | 300 | 1000 |
| Example 8 | 5 | 500 | 5.5 | 300 | 1800 |
| Example 9 | 5 | 500 | 5.5 | 300 | 1800 |
| Example 10 | 5 | 500 | 5.5 | 300 | 1800 |
| Comparative Example 1 | 5 | 300 | 3.5 | 300 | 100 |
| Comparative Example 2 | 4 | 500 | 4.5 | 300 | 550 |

The specific embodiments or examples given in the detailed description of the preferred embodiments are intended solely for purposes of illustration of principles of the invention and are not to be construed as limiting the invention. Accordingly, various modifications can be made to the described embodiments or examples without departing from the spirit and scope of the invention as set forth in the claims below.

INDUSTRIAL APPLICABILITY

As has been described, thin film EL devices according to the present invention are capable of capturing cations of a low work function metal, and thus the deterioration of the low work function metal can be inhibited. This allows improvement in the electroluminescent efficiency of the device and dramatic improvement in lifetime characteristics.

Furthermore, with the fabrication methods of thin film EL devices according to the present invention, thin film EL devices with high electroluminescent efficiencies and long light-emission lifetimes can be fabricated with good workability, good reproducibility, and improved yields, while inhibiting deterioration of the low work function metal occurring even during the fabrication process.

In display devices provided with thin film EL devices according to the present invention, because the devices include thin film EL devices with high electroluminescent efficiencies, high reliability, and long lifetimes, high-grade display devices can be provided.

Lighting systems provided with thin film EL devices according to the present invention have electroluminescent characteristics such as high electroluminescent efficiencies, high reliability, and long lifetimes, and thus high-grade lighting systems can be provided which are applicable, for example, to backlights for liquid crystal displays.

As has been discussed, according to the configurations of the present invention, the objects of the present invention can be sufficiently accomplished. Thus, the value of the present invention to industry is considerable.

What is claimed is:

1. A thin film EL device comprising:

an electron-injecting electrode containing at least two or more different metals having different work functions;

a hole-injecting electrode paired with the electron-injecting electrode; and a functional layer provided between the electron-injecting electrode and the hole-injecting electrode and having a light-emitting function, wherein the electron-injecting electrode contains a metal compound represented by following chemical formula (1):

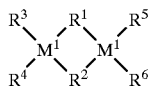

wherein $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^3$, $R^4$, $R^5$ and $R^6$ each independently is one selected from the group consisting of hydrogen, alkyl, an aryl derivative, and a derivative of a nitrogen-containing aromatic ring having one nitrogen atom as coordinating atom; and $M^1$ is a central metal.

2. The thin film EL device according to claim 1, wherein the electron-injecting electrode comprises:
   an electron-deficient substance layer provided on the functional layer and containing the metal compound represented by the chemical formula (1); and
   a metal layer provided on the electron-deficient substance layer and containing the at least two or more different metals having different work functions.

3. The thin film EL device according to claim 1, wherein the electron-injecting electrode comprises an electron-deficient substance layer containing the metal compound represented by the chemical formula (1) and a metal having the lower or lowest work function between or among the different metals having different work functions.

4. The thin film EL device according to claim 1, wherein metal compound represented by the chemical formula (1) has a pyrazabole structure.

5. A thin film EL device comprising:
   an electron-injecting electrode containing at least two or more different metals having different work functions;
   a hole-injecting electrode paired with the electron-injecting electrode; and
   a functional layer provided between the electron-injecting electrode and the hole-injecting electrode and having a light-emitting function,
   wherein the functional layer contains at least on a side of the electron-injecting electrode a compound represented by the following chemical formula (1):

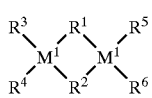

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom: $R^3$, $R^4$, $R^5$ and $R^6$ each independently is one selected from the group consisting of hydrogen, alkyl, and aryl derivative, and a derivative of nitrogen-containing aromatic ring having one nitrogen atom as coordinating atom; and $M^1$ is a central metal.

6. The thin film EL device according to claim 5, wherein the compound represented by the chemical formula (1) is uniformly contained on a side of the electron-injecting electrode within a given area.

7. The thin film EL device according to claim 5, wherein the compound represented by the chemical formula (1) is contained in the functional layer on a side of the electron-injecting electrode within a given area and is distributed such that a concentration thereof gradually increases toward the electron-injecting electrode.

8. The thin film EL device according to claim 5, wherein the compound represented by the chemical formula (1) has a pyrazabole structure.

9. A thin film EL device comprising:
   an electron-injecting electrode;
   a hole-injecting electrode paired with the electron-injecting electrode; and
   a functional layer provided between the electron-injecting electrode and the hole-injecting electrode and having a light-emitting function,
   wherein the functional layer contains a low work function metal and a compound represented by the following chemical formula (1):

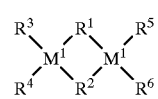

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom: $R^3$, $R^4$, $R^5$, and $R^6$ each independently is one selected from the group consisting of hydrogen, alkyl, and aryl derivative, and a derivative of nitrogen-containing aromatic ring having one nitrogen atom as coordinating atom; and $M^1$ is a central metal.

10. The thin film EL device according to claim 9, wherein the low work function metal and the compound represented by the chemical formula (1) are uniformly contained on a side of the electron-injecting electrode within a given area.

11. The thin film EL device according to claim 9, wherein the low work function metal and the compound represented by the chemical formula (1) are contained in the functional layer on a side of the electron-injecting electrode within a given area and are distributed such that concentrations thereof gradually increase toward the electron-injecting electrode.

12. The thin film EL device according to claim 9, wherein the compound represented by the chemical formula (1) has a pyrazabole structure.

13. A thin film EL device comprising:
   an electron-injecting electrode containing at least two or more different metals having different work functions;
   a hole-injecting electrode paired with the electron-injecting electrode; and
   a functional layer provided between the electron-injecting electrode and the hole-injecting electrode and having a light-emitting function,
   wherein the electron-injecting electrode contains a compound represented by the following chemical formula (2):

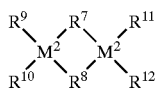

where $R^7$ and $R^8$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

14. The thin film EL device according to claim 13, wherein the electron-injecting electrode comprises:
a capture layer provided on the functional layer and containing the compound represented by the chemical formula (2); and
a metal layer provided on the capture layer and containing the at least two or more different metals having different work functions.

15. The thin film EL device according to claim 13, wherein the electron-injecting electrode includes a capture layer containing the compound represented by the chemical formula (2) and a metal having the lower or lowest work function between or among the different metals having different work functions.

16. The thin film EL device according to claim 13, wherein the compound represented by the chemical formula (2) has a pyrazabole structure.

17. A thin film EL device comprising:
an electron-injecting electrode containing at least two or more different metals having different work functions;
a hole-injecting electrode paired with the electron-injecting electrode; and
a functional layer provided between the electron-injecting electrode and the hole-injecting electrode and having a light-emitting function,
wherein the functional layer contains on a side of the electron-injecting electrode a compound represented by the following chemical formula (2):

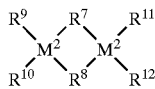

where $R^7$ and $R^8$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

18. The thin film EL device according to claim 17, wherein the compound represented by the chemical formula (2) is uniformly contained on a side of the electron-injecting electrode within a given area.

19. The thin film EL device according to claim 17, wherein the compound represented by the chemical formula (2) is contained in the functional layer on a side of the electron-injecting electrode within a given area and is distributed such that a concentration thereof gradually increases toward the electron-injecting electrode.

20. The thin film EL device according to claim 17, wherein the compound represented by the chemical formula (2) has a pyrazabole structure.

21. A thin film EL device comprising:
an electron-injecting electrode;
a hole-injecting electrode paired with the electron-injecting electrode; and
a functional layer provided between the electron-injecting electrode and the hole-injecting electrode and having a light-emitting function,
wherein the functional layer contains a low work function metal and a compound represented by the following chemical formula (1) for capturing the low work function metal in its ionic state, the low work function metal having a lower work function than the electron-injecting electrode:

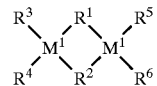

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom: $R^3$, $R^4$, $R^5$, and $R^6$ each independently is one selected from the group consisting of hydrogen, alkyl, and aryl derivative, and a derivative of nitrogen-containing aromatic ring having one nitrogen atom as coordinating atom; and $M^1$ is a central metal.

22. The thin film EL device according to claim 21, wherein the low work function metal and the compound represented by the chemical formula (1) are uniformly contained on a side of the electron-injecting electrode within a given area.

23. The thin film EL device according to claim 21, wherein the low work function metal and the compound represented by the chemical formula (1) are contained in the functional layer on a side of the electron-injecting electrode within a given area and are distributed such that concentrations thereof gradually increase toward the electron-injecting electrode.

24. A thin film EL device comprising:
an electron-injecting electrode containing at least two or more different metals having different work functions;
a hole-injecting electrode paired with the electron-injecting electrode; and
a functional layer provided between the electron-injecting electrode and the hole-injecting electrode and having a light-emitting function,
wherein the functional layer contains a low work function metal and a compound represented by the following chemical formula (2), the low work function metal having a lower work function than the electron-injecting electrode and the compound represented by the following chemical formula (2) accepting electrons emitted from the low work function metal:

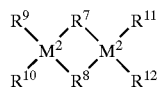
(2)

where $R^7$ and $R^8$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

25. A thin film EL device comprising:

an electron-injecting electrode containing at least two or more different metals having different work functions;

a hole-injecting electrode paired with the electron-injecting electrode; and a functional layer provided between the electron-injecting electrode and the hole-injecting electrode and having a light-emitting function, wherein the electron-injecting electrode contains:

a compound represented by the following chemical formula (1) for accepting electrons emitted from a low work function metal, the low work function metal being a metal other than a highest work function metal among the metals;

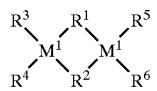
(1)

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom: $R^3$, $R^4$, $R^5$, and $R^6$ each independently is one selected from the group consisting of hydrogen, alkyl, and aryl derivative, and a derivative of nitrogen-containing aromatic ring having one nitrogen atom as coordinating atom; and $M^1$ is a central metal; and a compound represented by the following chemical formula (2) for capturing the low work function metal in its ionic:

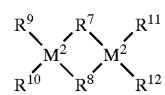
(2)

where $R^7$ and $R^8$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

26. The thin film EL device according to claim 25, wherein the electron-injecting electrode comprises:

an electron-deficient substance layer containing the compound represented by the chemical formula (1);

a capture layer contacting the electron-deficient substance layer and containing the compound represented by the chemical formula (2); and a metal layer containing the two or more different metal.

27. The thin film EL device according to claim 25, wherein the electron-injecting electrode includes:

an electron-deficient substance layer containing the compound represented by the chemical formula (1); and a capture layer contacting the electron-deficient substance layer and containing the compound represented by the chemical formula (2) and the low work function metal.

28. The thin film EL device according to claim 25, wherein the compound represented by the chemical formula (2) is an electron-accepting capturing substance for accepting electrons emitted from the low work function metal.

29. A thin film EL device comprising:

an electron-injecting electrode containing at least two or more different metals having different work functions;

a hole-injecting electrode paired with the electron-injecting electrode; and a functional layer provided between the electron-injecting electrode and the hole-injecting electrode and having a light-emitting function, wherein the functional layer contains an electron-deficient substance for accepting electrons omitted from a low work function metal and a capturing substance for capturing the low work function metal in its ionic state, the low work function metal being a metal other than a highest work function metal among the metals.

30. The thin film EL device according to claim 29, wherein the electron-deficient substance and the capturing substance are uniformly contained on a wide of the electron-injecting electrode within a given area.

31. The thin film EL device according to claim 29, wherein the electron-deficient substance and the capturing substance are contained in the functional layer on a side of the electron-injecting electrode within a given area and are distributed such that concentrations thereof gradually increase toward the electron-injecting electrode.

32. The thin film EL device according to claim 29, wherein the electron-deficient substance is a compound represented by the following chemical formula (1):

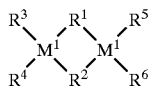

(1)

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^3$, $R^4$, $R^5$, and $R^6$ each independently is one selected from the group consisting of hydrogen, alkyl, an aryl derivative, and a derivative of a nitrogen-containing aromatic ring having one nitrogen atom as coordinating atom; and $M^1$ is a central metal.

33. The thin film EL device according to claim 29, wherein the capturing substance is an electron-accepting capturing substance for accepting electrons emitted from the low work function metal.

34. The thin film EL device according to claim 33, wherein the electron-accepting capturing substance is a compound represented by the following chemical formula (2):

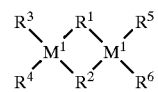

(2)

where $R^7$ and $R^9$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

35. A thin film EL device comprising:
an electron-injecting electrode;
a hole-injecting electrode paired with the electron-injecting electrode; and
a functional layer provided between the electron-injecting electrode and the hole-injecting electrode and having a light-emitting function,
wherein the functional layer contains a low work function metal having a lower work function than the electron-injecting electrode, a capturing substance for capturing the low work function metal in its ionic state, and an electron-deficient substance for accepting electrons emitted from the low work function metal.

36. The thin film EL device according to claim 35, wherein the low work function metal, the electron-deficient substance, and the capturing substance are uniformly contained on a side of the electron-injecting electrode within a given area.

37. The thin film EL device according to claim 35, wherein the low work function metal, the electron-deficient substance, and the capturing substance are contained in the functional layer on a side of the electron-injecting electrode within a given area and are distributed such that concentrations thereof gradually increase toward the electron-injecting electrode.

38. The thin film EL device according to claim 35, wherein the electron-deficient substance is a compound represented by the following chemical formula (1):

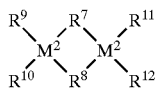

(1)

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^3$, $R^4$, $R^5$ and $R^6$ each independently is one selected from the group consisting of hydrogen, alkyl, an aryl derivative, and a derivative of a nitrogen-containing aromatic ring having one nitrogen atom as coordinating atom; and $M^1$ is a central metal.

39. The thin film EL device according to claim 35, wherein the capturing substance is an electron-accepting capturing substance for accepting electrons emitted from the low work function metal.

40. The thin film EL device according to claim 39, wherein the electron-accepting capturing substance is a compound represented by the following chemical formula (2):

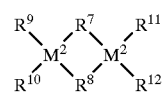

(2)

where $R^7$ and $R^8$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

41. A thin film EL device comprising:
an electron-injecting electrode containing at least two or more different metals having different work functions;
a hole-injecting electrode paired with the electron-injecting electrode; and
a functional layer provided between the electron-injecting electrode and the hole-injecting electrode and having a light-emitting function,
wherein one of an electron-deficient substance for accepting electrons emitted from a low work function metal and a capturing substance for capturing the low work function metal in its ionic state is contained in the electron-injecting electrode and the other is contained in the functional layer, the low work function metal being a metal other than a highest work function metal among the metals.

42. The thin film EL device according to claim 41, wherein the electron-deficient substance is a compound represented by the following chemical formula (1):

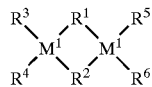

(1)

where $R^1$ and $R^2$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^3$, $R^4$, $R^5$, and $R^6$ each independently is one selected from the group consisting of hydrogen, alkyl, an aryl derivative, and a derivative of a nitrogen-containing aromatic ring having one nitrogen atom as coordinating atom; and $M^1$ is a central metal.

43. The thin film EL device according to claim 41, wherein the capturing substance is an electron-accepting capturing substance for accepting electrons emitted from the low work function metal.

44. The thin film EL device according to claim 43, wherein the electron-accepting capturing substance is a compound represented by the following chemical formula (2):

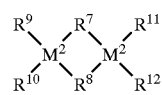

(2)

where $R^7$ and $R^8$ each independently is one selected from the group consisting of a bridging ligand containing a nitrogen-containing aromatic ring, a bridging ligand containing a derivative of a nitrogen-containing aromatic ring, halogen, and a bridging ligand containing alkyl of 1 to 3 carbons, the nitrogen-containing aromatic ring and the derivative of the nitrogen-containing aromatic ring each having at least one nitrogen atom as coordinating atom; $R^9$, $R^{10}$, $R^{11}$, and $R^{12}$ each independently is one selected from the group consisting of hydrogen, alkyl, an aryl derivative, and a heterocyclic derivative; and $M^2$ is a central metal.

* * * * *

UNITED STATES PATENT AND TRADEMARK OFFICE
CERTIFICATE OF CORRECTION

PATENT NO. : 6,849,346 B2
DATED : February 1, 2005
INVENTOR(S) : Mikiko Matsuo et al.

It is certified that error appears in the above-identified patent and that said Letters Patent is hereby corrected as shown below:

Title page,
Item [56], References Cited, FOREIGN PATENT DOCUMENTS, change
"10-134961    5/1996" to -- JP 10-134961    5/1998 --

Column 44,
Line 43, change "and aryl derivative" to -- an aryl derivative --.

Column 45,
Line 60, change "and aryl derivative" to -- an aryl derivative --;
Line 66, change "ionic" to -- ionic state --.

Column 46,
Line 28, change "metal" to -- metals --;
Line 50, change "omitted" to -- emitted --.
Line 57, change "wide" to -- side --.

Column 47,
Line 35, change "$R^9$" to -- $R^8$ --.

Signed and Sealed this

Second Day of August, 2005

JON W. DUDAS
*Director of the United States Patent and Trademark Office*